US010229082B2

(12) United States Patent
Ahmed et al.

(10) Patent No.: US 10,229,082 B2
(45) Date of Patent: Mar. 12, 2019

(54) SYSTEM AND METHOD FOR PROVIDING WIRELESS COMMUNICATIONS TO A BOXED SERVER

(71) Applicant: Dell Products, LP, Round Rock, TX (US)

(72) Inventors: Sajjad Ahmed, Round Rock, TX (US);
Travis E. Taylor, II, Hutto, TX (US);
Arulnambi Raju, Austin, TX (US);
Sudhir Shetty, Cedar Park, TX (US);
Jeffrey M. Lairsey, Round Rock, TX (US); David M. Warden, Leander, TX (US); Pritesh F. Prabhu, Georgetown, TX (US); Jinsaku Masuyama, Cedar Park, TX (US); John R. Palmer, Georgetown, TX (US)

(73) Assignee: Dell Products, LP, Round Rock, TX (US)

( * ) Notice: Subject to any disclaimer, the term of this patent is extended or adjusted under 35 U.S.C. 154(b) by 259 days.

(21) Appl. No.: 14/936,321

(22) Filed: Nov. 9, 2015

(65) Prior Publication Data

US 2017/0132168 A1     May 11, 2017

(51) Int. Cl.
*G06F 13/40* (2006.01)
*H05K 9/00* (2006.01)
*G06F 9/445* (2018.01)

(52) U.S. Cl.
CPC ...... *G06F 13/4068* (2013.01); *G06F 9/44505* (2013.01); *H05K 9/0062* (2013.01); *Y10S 277/92* (2013.01)

(58) Field of Classification Search
CPC .. Y10S 277/92; H05K 9/0062; H05K 9/0081; G06F 9/44505; G06F 8/65; G06Q 10/08; B65D 88/121; B65D 90/00; B65D 2585/6837; B65D 2590/0083
See application file for complete search history.

(56) References Cited

U.S. PATENT DOCUMENTS

| | | |
|---|---|---|
| 5,335,985 A | 8/1994 | Baur |
| 5,434,775 A | 7/1995 | Sims et al. |
| 5,483,423 A * | 1/1996 | Lewis ............... G06F 1/182 174/358 |
| 5,505,533 A | 4/1996 | Kammersqard et al. |
| 5,774,668 A | 6/1998 | Choquier et al. |
| 5,805,442 A | 9/1998 | Crater et al. |
| 5,869,820 A | 2/1999 | Chen et al. |
| 5,910,776 A | 6/1999 | Black |
| 5,913,034 A | 6/1999 | Malcolm |
| 5,926,463 A | 7/1999 | Ahearn et al. |
| 5,927,050 A * | 7/1999 | Houck ............... G06F 1/16 53/412 |

(Continued)

*Primary Examiner* — Brian T Misiura
(74) *Attorney, Agent, or Firm* — Larson Newman, LLP

(57) ABSTRACT

A crate for shipping an information handling system includes a first side comprising an electro-magnetic protective material. The electro-magnetic protective material inhibits electro-magnetic intrusions into the information handling. The crate also includes a second side comprising a first portion comprising the electro-magnetic protective material, and a second portion devoid of the electro-magnetic protective material. The second portion passes a wireless electro-magnetic signal to the information handling system.

18 Claims, 15 Drawing Sheets

(56) References Cited

U.S. PATENT DOCUMENTS

| | | | |
|---|---|---|---|
| 5,939,982 A * | 8/1999 | Gagnon | G08B 13/06 |
| | | | 324/627 |
| 5,956,665 A | 9/1999 | Martinez et al. | |
| 5,956,723 A | 9/1999 | Zhu | |
| 5,959,012 A | 9/1999 | Simonian et al. | |
| 6,057,981 A | 5/2000 | Fish et al. | |
| 6,112,246 A | 8/2000 | Horbal et al. | |
| 6,131,119 A | 10/2000 | Fukui | |
| 6,167,448 A | 12/2000 | Hemphill et al. | |
| 6,177,860 B1 * | 1/2001 | Cromer | G06F 9/44505 |
| | | | 340/10.1 |
| 6,282,175 B1 | 8/2001 | Steele et al. | |
| 6,566,973 B2 * | 5/2003 | Schumacher | H05K 7/1449 |
| | | | 333/12 |
| 6,601,084 B1 | 7/2003 | Bhaskaran et al. | |
| 6,654,347 B1 | 11/2003 | Wiedeman et al. | |
| 6,657,214 B1 * | 12/2003 | Foegelle | G01R 29/0821 |
| | | | 250/496.1 |
| 6,672,902 B2 * | 1/2004 | Skinner | H01R 13/6596 |
| | | | 174/378 |
| 6,714,977 B1 | 3/2004 | Fowler et al. | |
| 6,826,714 B2 | 11/2004 | Coffey et al. | |
| 6,927,688 B2 * | 8/2005 | Tice | G06K 7/10306 |
| | | | 340/539.1 |
| 7,081,587 B1 * | 7/2006 | Woolsey | H05K 7/1425 |
| | | | 174/135 |
| 7,149,884 B2 * | 12/2006 | O'Connor | G06F 1/16 |
| | | | 700/96 |
| 7,342,906 B1 | 3/2008 | Calhoun | |
| 7,508,683 B1 * | 3/2009 | Jochym | H05K 9/0062 |
| | | | 361/816 |
| 7,551,971 B2 * | 6/2009 | Hillis | H05K 7/1497 |
| | | | 267/140.11 |
| 7,601,921 B2 * | 10/2009 | Schroader | H05K 9/0043 |
| | | | 174/372 |
| 7,629,743 B2 * | 12/2009 | Murakami | G09G 3/3208 |
| | | | 313/504 |
| 7,696,506 B2 | 4/2010 | Lung | |
| 7,720,987 B2 | 5/2010 | Penk et al. | |
| 7,796,944 B2 * | 9/2010 | Eaton | H04W 4/02 |
| | | | 455/41.2 |
| 7,829,328 B2 * | 11/2010 | Yang | G01N 33/558 |
| | | | 427/2.11 |
| 7,902,964 B2 * | 3/2011 | Rommelmann | G06K 17/00 |
| | | | 235/375 |
| 8,037,330 B2 | 10/2011 | Livescu et al. | |
| 8,078,139 B2 * | 12/2011 | Twitchell, Jr. | B65D 88/121 |
| | | | 340/5.92 |
| 8,284,049 B2 * | 10/2012 | Blanchard | G08B 25/10 |
| | | | 340/539.26 |
| 8,477,045 B2 * | 7/2013 | Laffey | G06F 9/44505 |
| | | | 340/10.1 |
| 8,732,508 B2 | 5/2014 | Cochran et al. | |
| 8,797,161 B2 * | 8/2014 | Aflalo | B65D 88/741 |
| | | | 340/568.1 |
| 9,089,059 B1 * | 7/2015 | Haskin | G06F 1/1626 |
| 9,128,795 B2 * | 9/2015 | Nijenkamp | G06F 8/65 |
| 9,307,347 B2 * | 4/2016 | Reunamaki | G06F 8/65 |
| 9,345,178 B2 * | 5/2016 | Davis | H05K 9/0007 |
| 9,357,683 B2 * | 5/2016 | Liu | H05K 9/0032 |
| 9,361,877 B2 * | 6/2016 | Antonio | H04B 11/00 |
| 9,445,534 B2 * | 9/2016 | Bailey | H05K 9/0062 |
| 9,469,437 B2 * | 10/2016 | Kamath | B65D 25/14 |
| 9,806,424 B2 * | 10/2017 | Yonezawa | H01Q 13/18 |
| 2002/0095487 A1 | 7/2002 | Day et al. | |
| 2002/0141210 A1 | 10/2002 | Glannopoulos et al. | |
| 2003/0046339 A1 | 3/2003 | Ip | |
| 2003/0119209 A1 * | 6/2003 | Kaylor | G01N 33/56911 |
| | | | 436/548 |
| 2004/0010649 A1 | 1/2004 | Weaver et al. | |
| 2004/0111601 A1 | 6/2004 | Racz | |
| 2006/0039341 A1 | 2/2006 | Ptasinski et al. | |
| 2006/0164239 A1 * | 7/2006 | Loda | G06K 19/07327 |
| | | | 340/539.22 |
| 2007/0094426 A1 | 4/2007 | Chiang et al. | |
| 2008/0231459 A1 * | 9/2008 | Corder | G07C 5/008 |
| | | | 340/572.7 |
| 2008/0317021 A1 | 12/2008 | Ives et al. | |
| 2009/0189774 A1 | 7/2009 | Brundridge et al. | |
| 2009/0217073 A1 | 8/2009 | Brech et al. | |
| 2009/0307515 A1 | 12/2009 | Bandholz et al. | |
| 2010/0027687 A1 | 2/2010 | De Natale et al. | |
| 2010/0067210 A1 * | 3/2010 | Sato | B65D 81/00 |
| | | | 361/818 |
| 2010/0106154 A1 | 4/2010 | Harlev et al. | |
| 2010/0218465 A1 * | 9/2010 | Takaya | G06Q 30/02 |
| | | | 53/467 |
| 2010/0293250 A1 | 11/2010 | Ankaiah et al. | |
| 2011/0022245 A1 | 7/2011 | Goodrum et al. | |
| 2011/0162879 A1 * | 7/2011 | Bunyan | H01L 23/552 |
| | | | 174/378 |
| 2011/0179301 A1 | 7/2011 | Liu et al. | |
| 2012/0075139 A1 * | 3/2012 | Gagnon | G01S 5/0027 |
| | | | 342/357.29 |
| 2012/0178364 A1 * | 7/2012 | Dobyns | H04M 1/7253 |
| | | | 455/41.1 |
| 2012/0262956 A1 | 10/2012 | DeHaven | |
| 2012/0303767 A1 | 11/2012 | Renzin | |
| 2012/0317256 A1 | 12/2012 | Gadbois et al. | |
| 2013/0007249 A1 | 1/2013 | Wang et al. | |
| 2013/0290694 A1 | 10/2013 | Civilini et al. | |
| 2014/0284095 A1 * | 9/2014 | Behuniak | A45C 13/002 |
| | | | 174/377 |
| 2015/0263887 A1 | 9/2015 | Sajeepa et al. | |
| 2017/0126549 A1 | 5/2017 | Paramisivam | |
| 2017/0132168 A1 | 5/2017 | Ahmed et al. | |

\* cited by examiner

SYSTEM AND METHOD FOR PROVIDING WIRELESS COMMUNICATIONS TO A BOXED SERVER

FIELD OF THE DISCLOSURE

This disclosure generally relates to information handling systems, and more particularly relates to a system and method for provisioning and inventorying a powered off server in a data center.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

Figure 1:
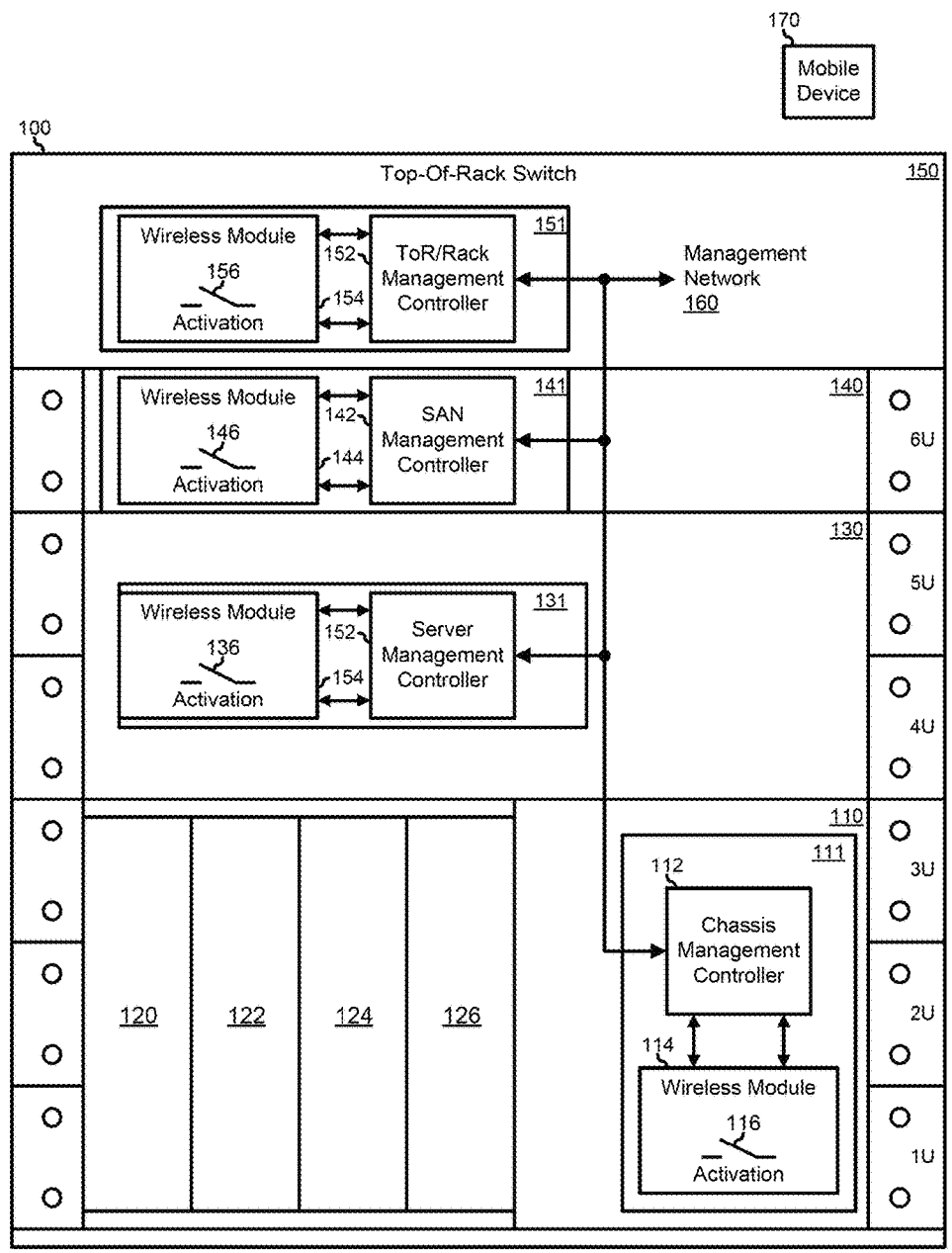
FIG. 1 is a view of a server rack according to an embodiment of the present disclosure.

FIG. 1 illustrates an embodiment of a server rack 100 including a blade chassis 110, a server 130, and storage 140 situated in a rack space of the server rack, and a top-of-rack (ToR) switch 150 at the top of the server rack. The rack space represents a standard server rack, such as a 19-inch rack equipment mounting frame or a 23-inch rack equipment mounting frame, and includes rack units, or divisions of the rack space that are a standardized unit of 1.75 inches high. For example, a piece of equipment that will fit an one of the rack units is referred to as a 1-U piece of equipment, another piece of equipment that takes up two of the rack units is referred to as a 2-U piece of equipment, and so forth. As such, the rack units are numbered sequentially from the bottom to the top as 1U, 2U, 3U, 4U, 5U, and 6U. The skilled artisan will recognize that other configurations for the rack units can be utilized as needed or desired. For example, a rack unit can be defined by the Electronic Components Industry Association standards council.

Blade chassis 110 represents a processing system of server rack 100 that is configured as a number of modular processing resources, or blades, that are provided in a common frame (i.e., the chassis). As such, blade chassis 110 includes server blades 120, 122, 124, and 126. Server 130 represents another processing system of server rack 100 that is configured as an individual processing resource. Storage 140 represents a data storage capacity of server rack 100 that provides a number of disk drives that are configured to the use of blade chassis 110 and of server 130, and can include other type of storage resource for server rack 100.

ToR switch 110 represents a network system of server rack 100, providing for high speed communications between blade chassis 110, server 130, storage 140, and a network (not illustrated). In particular, ToR switch 150 is connected to blade chassis 110, server 130, and storage 140 via a network fabric (not illustrated), to provide data routing between the elements.

Each element of server rack 100 includes a management system having a management controller and a wireless management module. As such, blade chassis 110 includes a chassis management system 111 with a chassis management controller 112 and a wireless management module 114, server 130 includes a server management system 131 with a server management controller 132 and a wireless management module 134, storage 140 includes a storage management system 111 with a storage management controller 142 and a wireless management module 144, and ToR switch 150 includes a ToR management system 151 that includes a ToR management controller 152 and a wireless management module 154. Each of wireless management modules 114, 134, 144, and 154 include a respective activation switch 116, 136, 146, and 156, and respective indicators 118, 138, 148, and 158, described further, below.

Management systems 111, 131, 141, and 151 are connected together via a management network 160 to provide for out-of-band monitoring, management, and control of the respective elements of server rack 100. For example, management systems 111, 131, 141, and 151 can provide system monitoring functions, such as temperature monitoring, power supply monitoring, physical intrusion monitoring, hot-swap and hot-plug monitoring, other monitoring functions that can be performed outside of a hosted environment of the respective elements of server rack 100, or other system monitoring functions as needed or desired. Management systems 111, 131, 141, and 151 can also provide system management and control functions for the respective elements of server rack 100, such as cooling fan speed control, power supply management, hot-swap and hot-plug management, firmware management and update management for system BIOS or UEFI, Option ROM, device firmware, and the like, or other system management and control functions as needed or desired. As such, management controllers 112, 132, 142, and 152 represent embedded controllers associated with the respective elements of server rack 100 that operate separately from a hosted processing environment of the respective elements. For example, management controllers 112, 132, 142, and 152 can include a baseboard management controller (BMC), an Integrated Dell Remote Access Controller (IDRAC), or another type of management controller as needed or desired. Further, management controllers 112, 132, 142, and 152 can operate in accordance with an Intelligent Platform Management Interface (IPMI) specification, a Web Services Management (WSMAN) standard, or another interface standard for embedded management systems, as needed or desired. The skilled artisan will recognize that management controllers 112, 132, 142, and 152 can include other circuit elements, devices, or sub-systems, such as an embedded controller, a logic device such as a Programmable Array Logic (PAL) device, a Complex Programmable Logic Device (CPLD), a Field-Programmable Gate Array (FPGA) device, or the like, multiplexors, and other devices as needed or desired to provide the functions and features as described herein.

Wireless management modules 114, 134, 144, and 154 operate to provide wireless connectivity between a user with a wireless enabled mobile device 170 and management network 160 through the respective management controllers 112, 132, 142, and 152. For example, wireless management modules 114, 134, 144, and 154 can include WiFi wireless interfaces in accordance with one or more IEEE 802.11 specifications for high-speed data communication between mobile device 170 and the wireless management modules, at speeds of up to 30 mega-bits per second (MBPS) or more. Wireless management modules 114, 134, 144, and 154 can also include Bluetooth wireless interfaces in accordance with one or more Bluetooth specifications, including Bluetooth Low Energy (BLE), also known as Bluetooth Smart (BTS), for lower-speed communications at speeds of up to 150 kilo-bits per second (Kbps) or more.

Wireless management modules 114, 134, 144, and 154 include various security features to ensure that the connection between mobile device 170 and management network 160 is secure and that the user of the mobile device is authorized to access the resources of the management network. In particular, wireless management modules 114, 134, 144, and 154 operate to provide various WiFi user and device authentication schemes, such as schemes that are in accordance with one or more IEEE 802.11 specifications, Service Set Identification (SSID) hiding, Media Access Control Identification (MAC ID) filtering to allow only pre-approved devices or to disallow predetermined blacklisted devices, Static Internet Protocol (IP) addressing, Wired Equivalent Privacy (WEP) encryption, WiFi Protected Access (WPA) or WPA2 encryption, Temporary Key Integrity Protocol (TKIP) key mixing, Extensible Authentication Protocol (EAP) authentication services, EAP variants such as Lightweight-EAP (LEAP), Protected-EAP (PEAP), and other standard or vendor specific user and device authentication schemes, as needed or desired. Further, wireless management modules 114, 134, 144, and 154 operate to provide various Bluetooth device and service authentication schemes, such as a Security Mode 2 service level-enforced security mode that may be initiated after link establishment but before logical channel establishment, a Security Mode 3 link level-enforced security mode that may be initiated before a physical link is fully established, a Security Mode 4 service level-enforced security mode that may be initiated after link establishment but before logical channel establishment and that uses a Secure Simple Pairing (SSP) protocol, or other device or service authentication schemes, as needed or desired.

In a particular embodiment, wireless management modules 114, 134, 144, and 154 also provide additional security features that further assure the user, device, and service security of the connection between mobile device 170 and management network 160. In particular, wireless management modules 114, 134, 144, and 154 each include an activation switch 116, 136, 146, and 156, respectively, that operate to enable the establishment of the connection between the mobile device and the wireless management modules. In this way, the establishment of the connection between mobile device 170 and wireless management modules 114, 134, 144, and 154 is predicated on the physical proximity of a user and of the user's mobile device to server rack 100, and also upon an action indicating a request to establish the connection. Here, a remote device and user would not be able to initiate an attack on management network 160 because of the lack of physical proximity to server rack 100 to activate activation switches 116, 136, 146, or 156, and so any attempt to attack management network would have to wait at least until a service technician activated one of the activation switches. In another embodiment, one or more of wireless management modules 114, 134, 144, and 154 and mobile device 170 operate to detect a Received Signal Strength Indication (RSSI) or a Received Channel Power Indication (RCPI) to permit the determination of the proximity between the mobile device and the wireless management modules, as described further, below. In a particular embodiment, one or more of wireless management modules 114, 134, 144, and 154 does not include an activation switch, and the particular wireless management modules provide for the establishment of the connection between the mobile device the wireless management modules in response to another activation request from the mobile device.

The elements of server rack 100, blade chassis 110, server 130, storage 140, and ToR switch 150 are exemplary, and more or fewer elements can be considered to be included in the server rack as needed or desired, and that other types of elements can be included in the server rack as needed or desired. Further, the management network of server rack 100 can include management controllers associated with more or fewer elements or different types of elements, and needed or desired.

Figure 2:
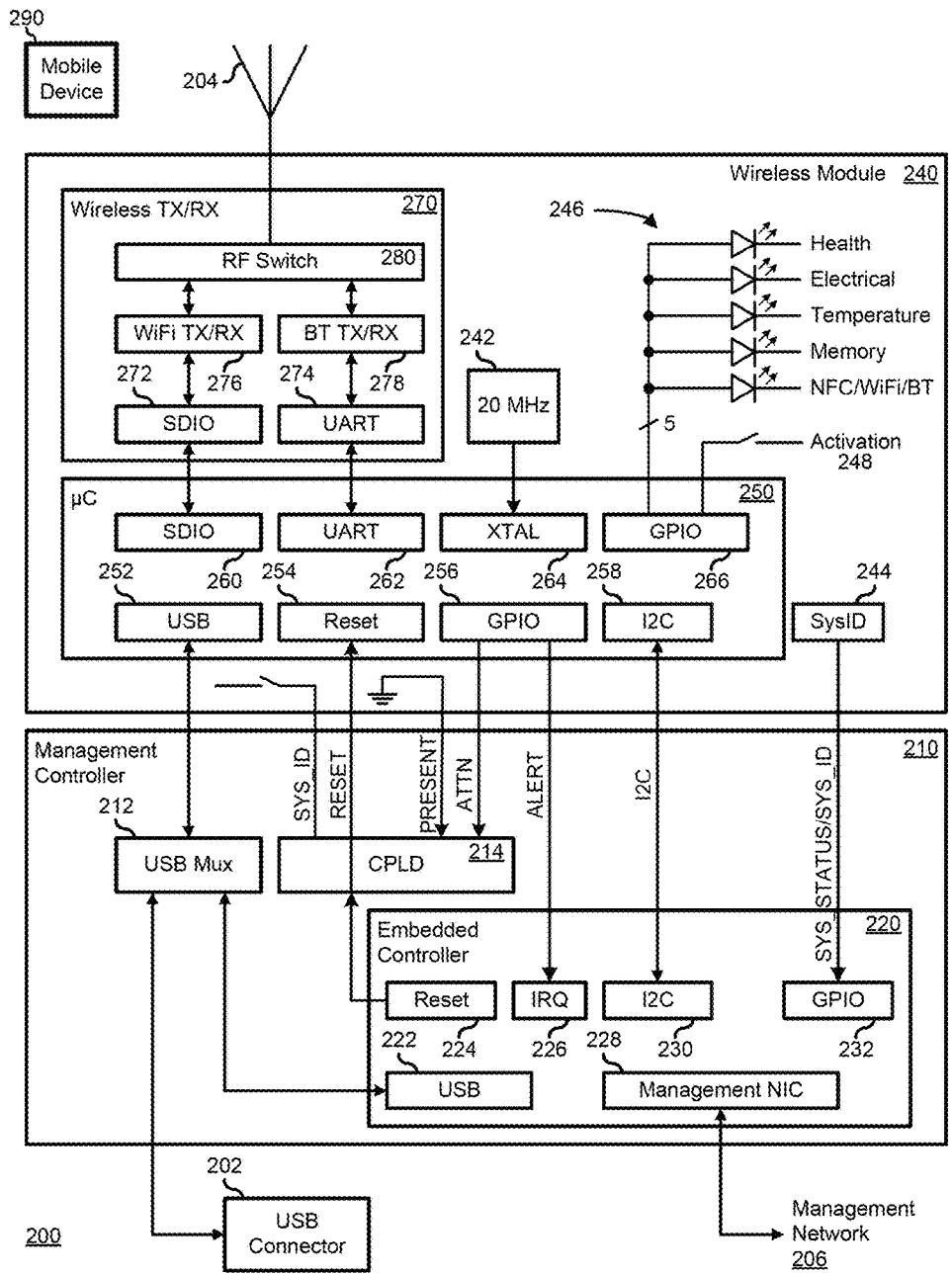
FIG. 2 is a block diagram illustrating a management system of the server rack of FIG. 1.

FIG. 2 illustrates a management system 200 similar to management systems 111, 131, 141, and 151, and includes a management controller 210 that is similar to management controllers 112, 132, 142, and 152, a wireless management module 240 similar to wireless management modules 114, 134, 144, and 154, a USB connector 202, a wireless device antenna 204, and a connection to a management network 206. Management controller 210 includes a USB multiplexor 212, a CPLD 214, and an embedded controller 220. Embedded controller 220 includes a USB interface 222, a reset function output 224, an interrupt request input 226, a management network interface device (NIC) 228, an Inter-Integrated Circuit (I2C) interface 230, and a General Purpose I/O (GPIO) 232.

Wireless management module 240 includes a 20 megahertz (MHz) crystal 242, a system ID module 244, indicators 246, an activation switch 248, a micro-controller 250, and a wireless transceiver module 270. Micro-controller 250 includes a USB interface 252, a reset function input 254, GPIOs 256 and 266, an I2C interface 258, a Secure Digital I/O (SDIO) interface 260, a Universal Asynchronous Receiver/Transmitter (UART) 262, and a crystal input 264. Wireless transceiver module 270 includes and SDIO interface 72, a UART 274, a WiFi transceiver 276, a Bluetooth transceiver 278, and a Radio Frequency (RF) switch 280. Management controller 210 and wireless management module 240 will be understood to include other elements, such as memory devices, power systems, and other elements as needed or desired to perform the operations as described herein. In a particular embodiment, wireless management module 240 is configured as a pluggable module that can be installed into management system 200, or not, as needed or desired by the user of a rack system that includes the management system. The skilled artisan will recognize that other configurations can be provided, including providing one or more element of management controller 210 or wireless management module 240 as a pluggable module, as elements on a main board of management system 200, or as integrated devices of the management system.

USB multiplexor 212 is connected to USB connector 202, and USB interfaces 222 and 252 to make a selected point-to-point USB connection. For example, a connection can be made between a USB device plugged in to USB connector 202 and embedded controller 220 by connecting the USB connector to USB interface 222. In this way, a device plugged in to USB connector 202 can access the management functions and features of the information handling system that is managed by management controller 210, and can access management network 206. Alternatively, a connection can be made between a USB device plugged in to USB connector 202 and micro-controller 250 by connecting the USB connector to USB interface 252. In this way, a device plugged in to USB connector 202 can access the management functions and features of wireless management module 240. For example, a technician in a data center can connect a laptop device to USB connector 202, configure USB multiplexor 212 to make a point-to-point connection to USB interface 252, and provide a firmware update for wireless management module 240. Finally, a connection can be made between embedded controller 220 and micro-controller 250 by connecting USB interface 222 to USB interface 222. In this way, a mobile device 290 that has established a wireless connection to wireless management module 240 can access the management functions and features of the information handling system that is managed by management system 200, the mobile device can access management network 206, and the management network can be used to access the management functions and features of the wireless management module or to provide a firmware update for the wireless management module. USB connector 202, USB multiplexor 212, and USB interfaces 222 and 252 can be configured in accordance with the USB Standard Revision 3.1, or with another USB Standard Revision, as needed or desired. In updating the firmware of wireless management module 240, micro-controller 250 operates to provide version retrieval, fail-safe updating, signature validation, and other operations needed or desired to perform the firmware update of the wireless management module. In a particular embodiment, management controller 210 does not include USB multiplexor 212, and USB interfaces 222 and 252 are directly connected together.

CPLD 214 represents a logic device for implementing custom logic circuitry to interface between various off-the-shelf integrated circuits, and particularly between embedded controller 220 and micro-controller 250. In particular, CPLD 214 operates to receive a system identification input (SYS_ID) from wireless management module 240, to receive the reset signal from reset function output 224, to forward the reset signal to reset function input 254, to receive a module present (PRESENT) signal from the wireless management module, and to receive an interrupt (INT) signal from GPIO 256. The SYS_ID can be provided based upon one or more settings, such as jumper settings, fusible links, register settings, or other settings, as needed or desired. In another embodiment, one or more functions of CPLD 214 is provided by embedded controller 220, or by micro-controller 250, as needed or desired.

Embedded controller 220 represents an integrated device or devices that is utilized to provide out-of-band management functions to the information handling system that includes management system 200, and can include a BMC, an IDRAC, or another device that operates according to the IPMI specification. In particular, embedded controller 220 operates to receive an interrupt alert (ALERT) signal from GPIO 258 on interrupt request input 230, to send and receive information between I2C 230 and I2C 258, and to receive system status information and system identification information (SYS_STATUS/SYS_ID) from system ID module 244.

Micro-controller 250 represents an embedded controller that operates to control the functions and features of wireless module 240, as described further, below. Micro-controller 250 operates to send and receive information between SDIO interface 260 and SDIO interface 272, to send and receive information between UART 262 and UART 274, to receive a crystal clock signal input from crystal 242, to provide control outputs from GPIO 266 to indicators 246, and to receive an activation input from activation switch 248 at GPIO 266. Indicators 246 provide visual indications of various statuses for wireless management module 240, including a health indication, a electrical/power indication, a temperature indication, a memory status indication, and a radio status indication that identifies the type of a mobile device that is connected to wireless management module, such as a WiFi device, a Bluetooth device, or a Near Field Communication (NFC) device. In a particular embodiment, micro-controller 250 provides other modes of communication between management controller 210 and wireless transceiver module 270, as needed or desired.

Wireless transceiver module 270 represents a mixed-signal integrated circuit device that operates to provide the radio signal interface to a mobile device 290 and to provide data interfaces to micro-controller 250. As such, wireless transceiver module 270 includes a WiFi channel that includes SDIO interface 272 and WiFi transceiver 276, and a Bluetooth channel that includes UART 274 and Bluetooth transceiver 278 that each are connected to RF switch 280. RF switch 280 switches antenna 204 to selectively provide WiFi communications or Bluetooth communications to mobile device 290. In a particular embodiment, wireless transceiver module 270 represents an off-the-shelf device to provide WiFi and Bluetooth wireless communications with mobile device 290.

Management controller 210 operates to provide management and configuration of wireless management module 240, such as by providing firmware updates, SSID configuration, WEP or WPA2 passwords, and the like. In interfacing with management controller 210, wireless management module 240 is represented as a composite USB device, and is connected as two different devices to the management controller. In operating with a WiFi connected mobile device, such as mobile device 290, management controller 210 instantiates a USB class NIC device driver, and the management controller treats the wireless management module in accordance with an Ethernet Remote Network Driver Interface Specification (RNDIS), a USB Communication Device Class (CDC) device, a USB NIC, or another USB network class device. Thus, as viewed from management controller 210, wireless management module 240 operate as a USB NIC, and as viewed from mobile device 290 the wireless management module operates as a WiFi class device, as described further below.

In operating with a Bluetooth connected mobile device, such as mobile device 290, management controller 210 acts as a Bluetooth Host Controller, using a Host Controller Interface (HCI) protocol to communicate with wireless management module 240 via a serial port (UART). In another embodiment, wireless management module 240 is viewed by management controller 210 as a Bluetooth dongle. Thus, as viewed from management controller 210, wireless management module 240 operate as a USB CDC, and as viewed from mobile device 290 the wireless management module operates as a Bluetooth device, as described further below.

Wireless management module 240 operates to deactivate one or more of the WiFi stack and the Bluetooth stack in response to a timeout event. As such, micro-controller 250 can include a timer that determines if a connected device has gone dormant or otherwise ceased to interact with management system 200, such as when mobile device 290 has moved out of range of wireless management module 240. Here, wireless management module 240 can suspend the connected session with the mobile device, and no new session will be initiated until activation switch 248 is activated to indicate that a new session is requested. For example, when a user who is connected using mobile device 290 with management system 200, but subsequently walks away from a server rack that includes the management system, wireless management module 240 can automatically detect the time that the connection is idle, and, after a predetermined duration, can shut down the connection and suspend all wireless activity until a new session is requested. Further, wireless management module 240 operates such that a selected one or both of the WiFi stack and the Bluetooth stack can be disabled. In a particular embodiment, wireless management module 240 operates to configure the transmission power level of the WiFi channel and of the Bluetooth channel.

Mobile device 290 represents a wireless communication enabled device, such as a tablet device, a laptop computer, a smart phone, and the like, that is configured to interact with management system 200 via a wireless connection to wireless management module 240. In particular, mobile device 290 can include a mobile operating system (OS), such as an Android OS, an iOS, a Windows mobile OS, or another mobile OS that is configured to operate with the hardware of the mobile device. As such, the hardware of mobile device 290 can include Android-enabled hardware, iOS-enabled hardware, Windows-enabled hardware, or other hardware, as needed or desired.

Figure 3:
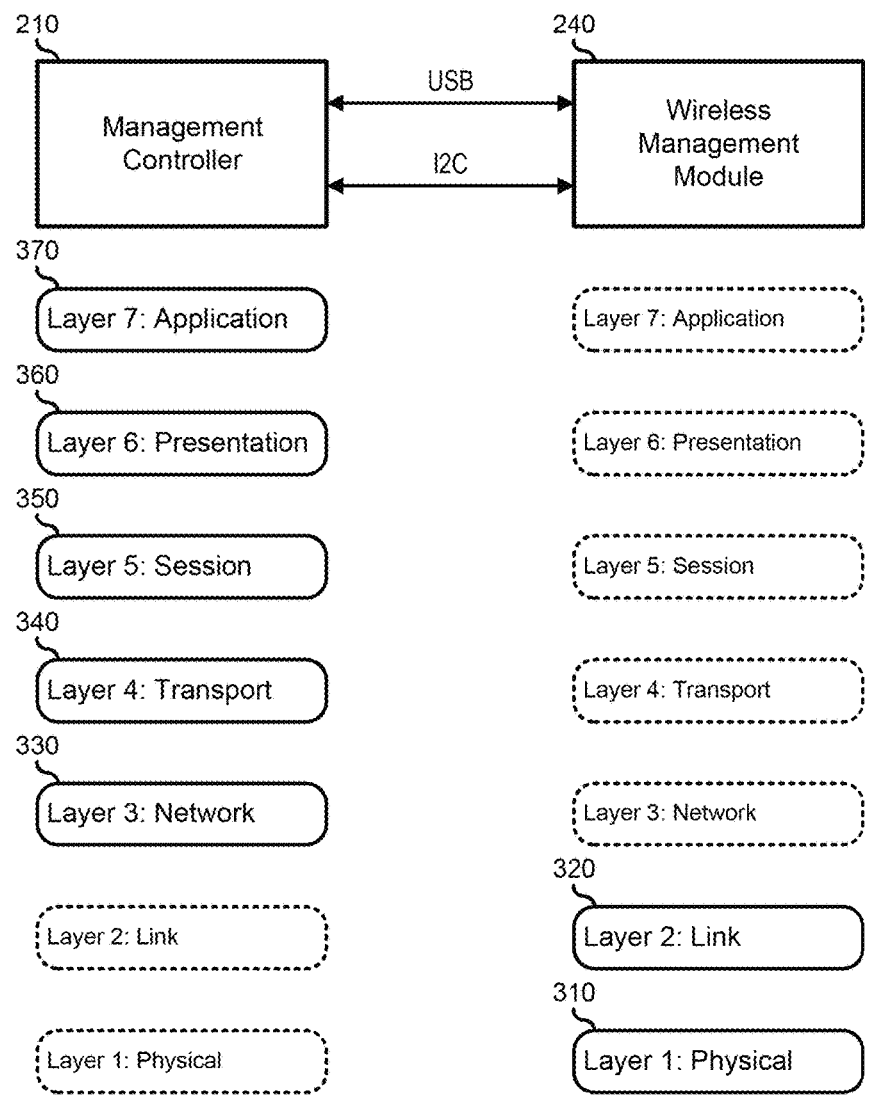
FIG. 3 is an illustration of an OSI layer arrangement of the management system of FIG. 2.

FIG. 3 illustrates management system 200, including the stack up of an Open Systems Interconnection (OSI) communication model layer arrangement for the management system. Here, the physical layer (L1) 310 and the link layer (L2) 320 are included in the functionality of wireless management module 240, and the network layer (L3) 330, the transport layer (L4) 340, the session layer (L5) 350, the presentation layer (L6) 360, and the application layer (L7) 370 are included in management controller 210.

Figure 4:
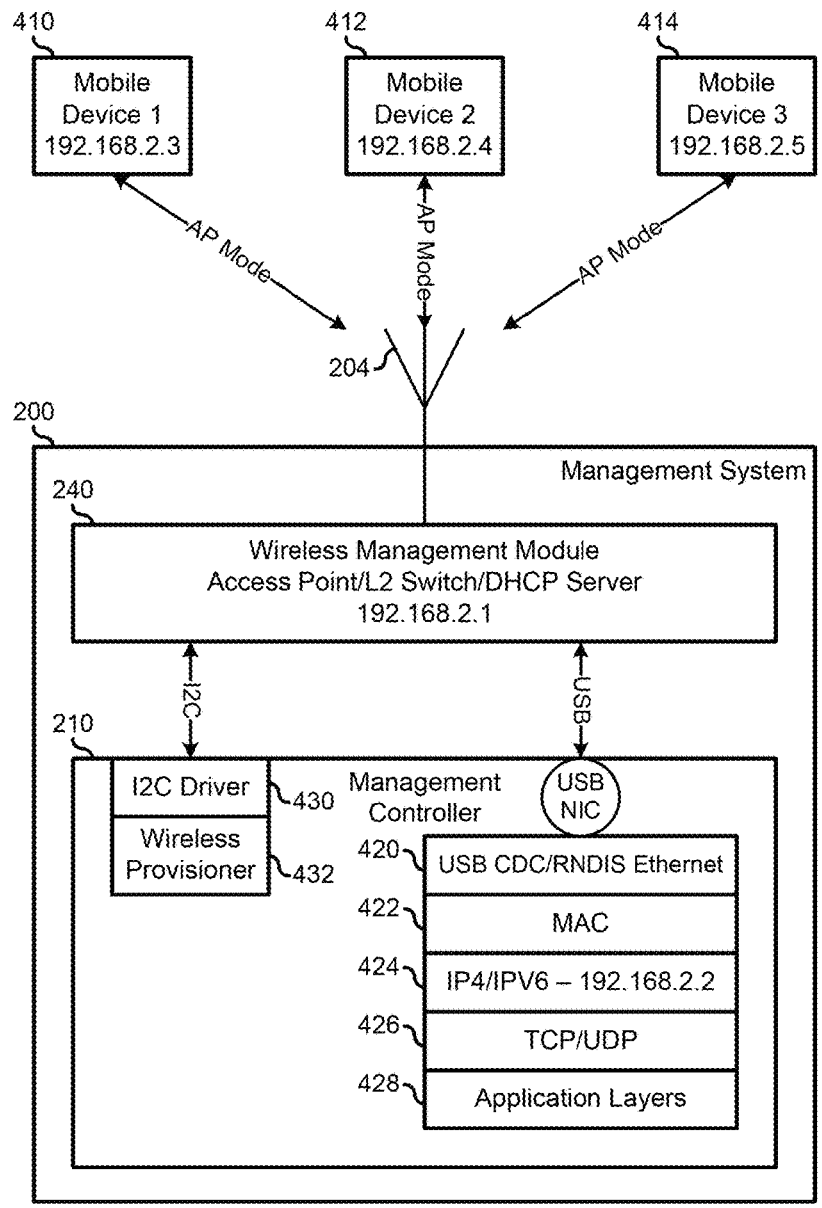
FIGS. 4 and 5 are block diagrams of various embodiments of wireless WiFi-based management networks on the management system of FIG. 2.

FIG. 4 illustrates an embodiment of a wireless WiFi-based management network 400 on management system 200. Here, wireless management module 240 presents itself to management controller 210 as a USB NIC functionality, and the management controller is illustrated as providing a USB NIC functionality by including a USB CDC/RNDIS Ethernet driver 420, a MAC address 422, an IP address 424 (192.168.2.2), a Transmission Control Protocol (TCP) and User Datagram Protocol (UDP) layer 426, and an application layer 428. Management controller 210 is also illustrated as providing an I2C interface including an I2C driver 430 and a wireless provisioner 432. Note that the IP address can be an IP version 4 (IP4) address, as illustrated, or an IP version 6 (IPV6) address, as needed or desired. Wireless management module 240 operates independently from management controller 210 in establishing and maintaining WiFi-based management network 400.

In establishing WiFi-based management network 400, wireless management module 240 is configured as a wireless access point that allows multiple mobile devices to be connected to management system 200. As such, management system 200 is illustrated as being connected with mobile devices 410, 412, and 414. Wireless management module 240 provides WiFi security functionality to mobile devices 410, 412, and 414, such as by screening the WIFI SSID so that only mobile devices that are aware of the existence of the wireless management module can be provide a request to be connected, by providing a key secured establishment of the connection, by encrypting communications between the mobile devices and the wireless management module using WEP, WPA, WPA2, or another encryption protocol, by providing other security assurance functions and features, or a combination thereof.

In addition, wireless management module 240 operates as a Dynamic Host Configuration Protocol (DHCP) host that provides a unique IP address to connected mobile devices 410, 412, and 414, the wireless management module can establish the connections with the mobile devices based upon static IP addresses of the mobile devices, or the wireless management module can provide a sub-network using a combination of DHCP-provided IP addresses and static IP addresses, as needed or desired. Further, wireless management module 240 views management controller 210 as a separate IP endpoint and can provide the management controller with a DHCP-provided IP address or the management controller can include a static IP address as needed or desired. In another embodiment, management controller 210 operates as a DHCP host that provides IP addresses to connected mobile devices 410, 412, and 414. In a particular embodiment, the DHCP host operates in accordance with the DHCPv6 specification, in a stateless auto-configuration mode, or another IP protocol.

Further, wireless management module 240 operates as a Layer-2 switch that redirects packets on the sub-network to the targeted endpoints. As such, mobile devices 410, 412, and 414, wireless management module 240, and management controller 210 can communicate with each other on the sub-network provided by the wireless management module. Also, wireless management module 240 operates to distribute gateway information to mobile devices 410, 412, and 414, and to management controller 210. Further, wireless management module 240 supports blacklisting and whitelisting of specific IP addresses that request access to management system 200.

In a particular embodiment, management controller 210 operates to provide various configuration information to wireless management module 240 via wireless provisioner 432, which tunes and controls the behavior of the wireless management module over the I2C bus. As such, management controller 210 can provide SSIDs, security keys, gateway addresses, and other configuration information, to wireless management module 240 via one of USB interfaces 212 and 252, and I2C interfaces 230 and 258. Here, because USB interfaces 212 and 252 and I2C interfaces 230 and 258 are within a server rack, and thus are deemed to be secure, wireless management module 240 does not need to employ additional security measures in accepting such configuration information from management controller 210. In another embodiment, wireless management module 240 receives the various configuration information from one or more of mobile devices 410, 412, and 414. Here, because a connection between wireless management module 240 and mobile devices 410, 412, and 414 is less secure than the connection to management controller 210, the wireless management module includes a management mode that is accessed via additional security and authentication functions and features in order to ensure that the users of the mobile devices are authorized to make such configuration modifications. For example, the management mode can be accessed via an additional username and password verification, via a hardware device authentication, or another mechanism for providing security and authentication, as needed or desired. In another embodiment, communications between management controller 210 and wireless management module 250 is conducted by other communication interfaces than USB interfaces 212 and 252, and I2C interfaces 230 and 258, as needed or desired.

A method of providing WiFi-based management network 400 on management system 200 includes powering on the management system, and determining that wireless management module 240 is installed into the management system. If wireless management system 240 is installed, then management controller 210 issues a DHCP request to connect to the access point that is established on the wireless management module. Wireless management module 240 assigns an IP address (192.168.2.2) to management controller 210 that is in the same sub-network as the access point (192.168.2.1). Next, mobile device 410 issues a DHCP request to connect to the access point and wireless management module 240 assigns an IP address (192.168.2.3) to the mobile device. Similarly, mobile devices 412 and 414 issue DHCP requests to connect to the access point and wireless management module 240 assigns IP addresses (192.168.2.4 and 192.168.2.5) to the mobile devices. In this way, management controller 210, wireless management module 240, and mobile devices 410, 412, and 414 can communicate over the sub-network with each other.

Figure 5:
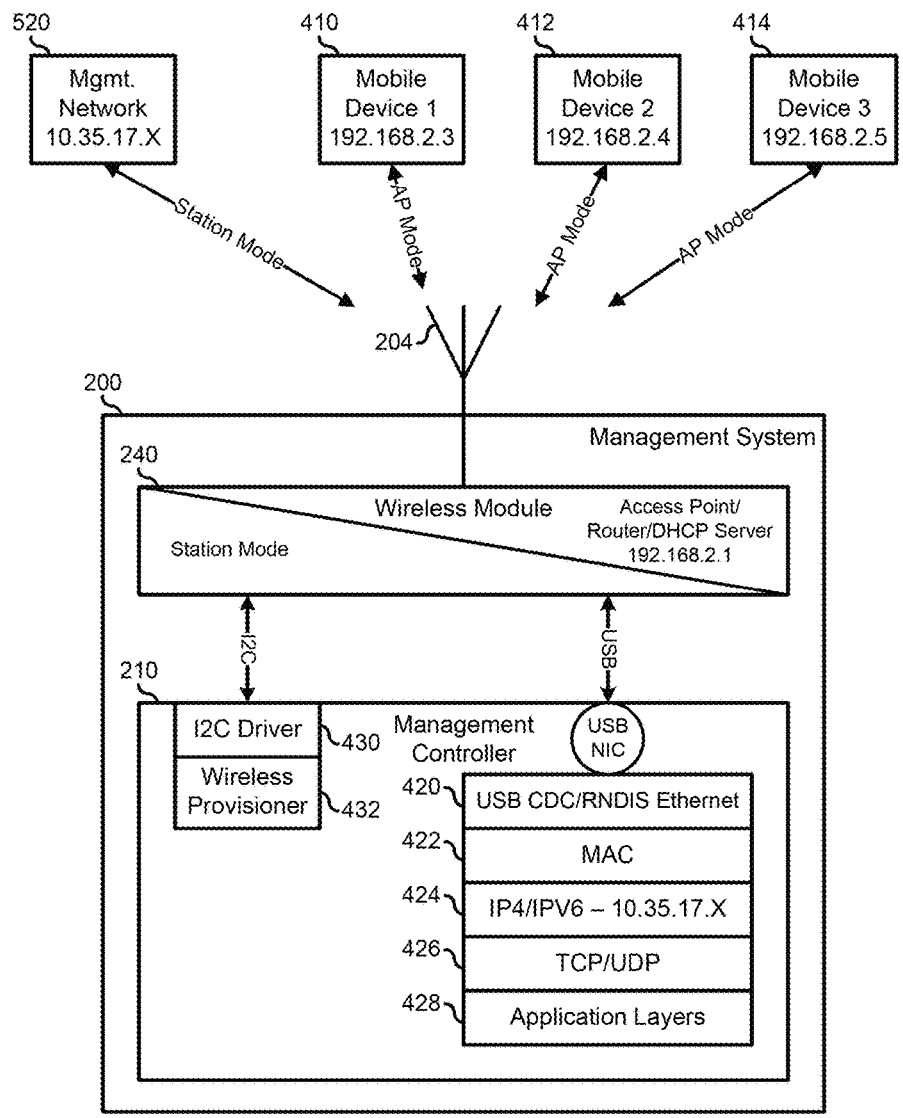

FIG. 5 illustrates another embodiment of a wireless-based management network 500 on management system 200. WiFi based management network 500 includes the functions and features of WiFi based management network 400, where wireless management module 240 operates in an access point mode to form a sub-network with mobile devices 410, 412, and 414. In addition to establishing WiFi-based management network 400, wireless management module 240 is configured as a wireless base station that permits the wireless management module to connect to a wireless management network 520 on a different sub-network. In the wireless base station mode, wireless management module 240 operates as a wireless client to wireless management network 520, such that the wireless management module operates to provide a DHCP request and authentication credentials to the wireless management network, and is authenticated by the wireless management network. Here, wireless management module 240 operates as a router that permits mobile devices 410, 412, and 414, and management controller 210 to communicate with wireless management network 520. In another embodiment, management controller 210 operates as the router, as needed or desired.

In a particular embodiment, management controller 210 is established as a node on wireless management network 520. Here, in one case, management controller 210 can be initially connected to, and established as a node on management network 520 through wireless management module 240, and then the wireless management module can establish the access point sub-network with mobile devices 410, 412, and 414. In another case, wireless management module 240 can establish the access point sub-network with mobile devices 410, 412, and 414, and management controller 210, as described above. Then, management controller 210 can perform a USB disconnect and a USB reconnect to wireless management module 240, and can send a DHCP request and authentication credentials to wireless management network 520 to obtain an IP address that is on the sub-network of the wireless management network.

A method of providing WiFi-based management network 500 on management system 200 includes the method for providing WiFi-based management network 400, as described above. After management controller 210, wireless management module 240, and mobile devices 410, 412, and 414 are established on the first sub-network, the management controller directs the wireless management module 240 to operate in a concurrent access point and base station mode. Wireless management module 240 then disconnects from the USB interface and reconnects to the USB interface with management module 210, and the management module sends SSID and authentication information to the wireless management module. Wireless management module 240 then sends a DHCP request and the authentication information to wireless management network 520. Wireless management network 520 sends an IP address (10.35. 17.X) to management controller 210 and authenticates the management controller onto the new sub-network. Here, because wireless management module 240 operates as a router, mobile devices 410, 412, and 414 can also communicate with wireless management network 520.

Figure 6:
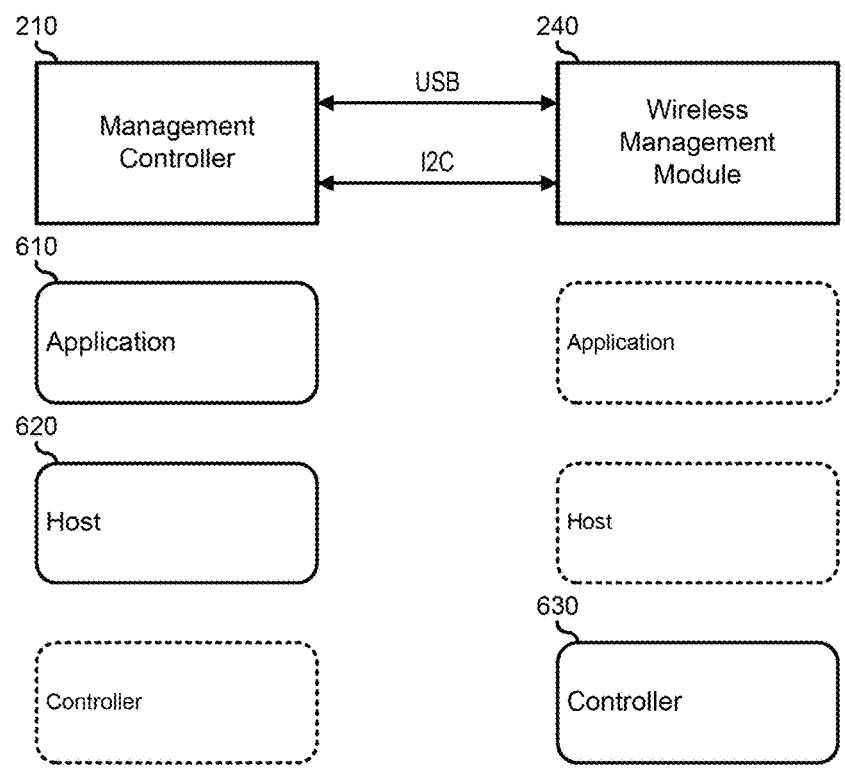
FIG. 6 is an illustration of a Bluetooth stack arrangement of the management system of FIG. 2.

FIG. 6 illustrates management system 200, including the stack up of a Bluetooth communication arrangement for the management system. Here, the application 610 and the host 620 are included in the functionality of management controller 210, and the controller 630 is included in the functionality of wireless management module 240.

Figure 7:
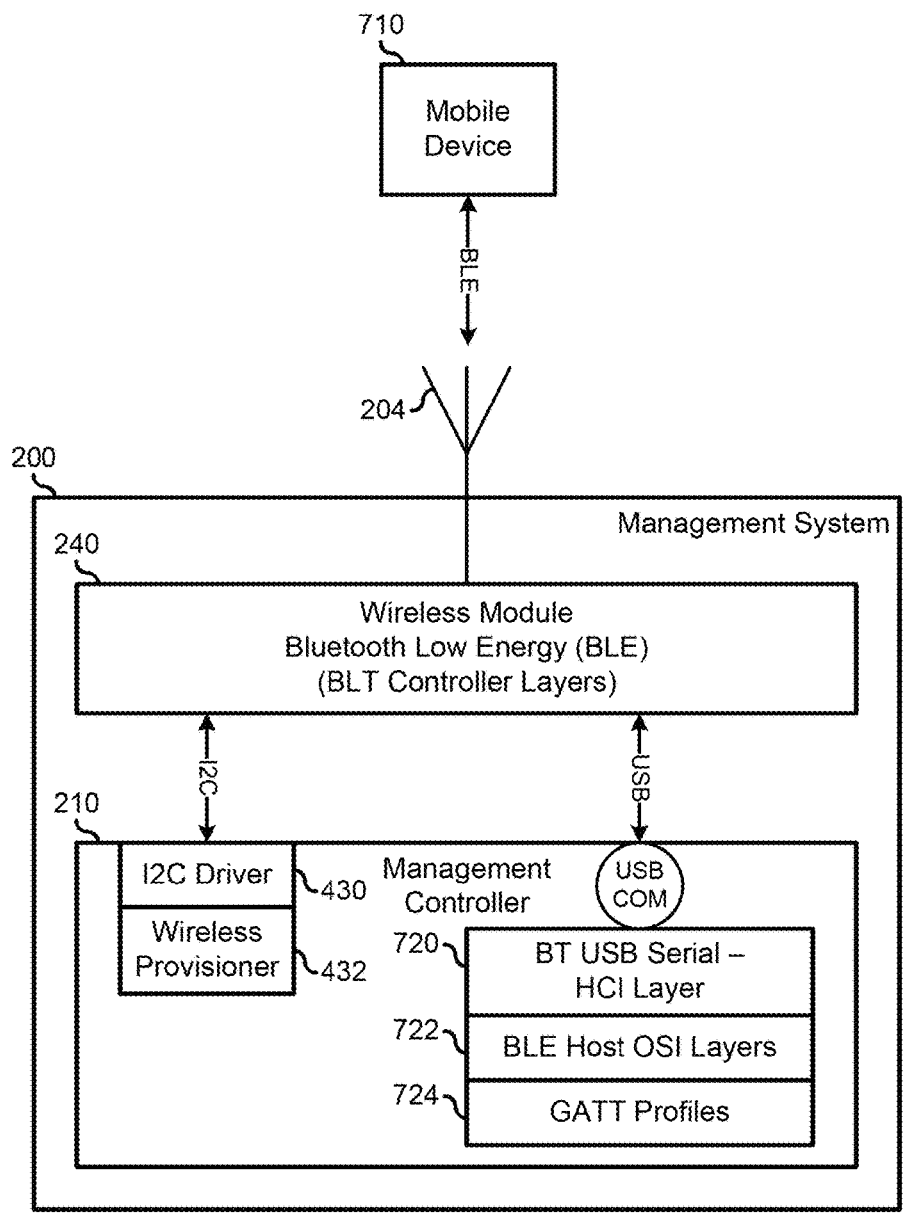
FIG. 7 is a block diagram of a wireless Bluetooth-based management network on the management system of FIG. 2.

FIG. 7 illustrates an embodiment of a wireless Bluetooth-based management network 700 on management system 200. Here, wireless management module 240 presents itself to management controller 210 as a USB COM port functionality, and the management controller is illustrated as including a Bluetooth USB-HCI layer 720, Bluetooth Low Energy (BLE) host OSI layers 722, and Bluetooth Generic Attribute Profiles (GATT) 724. Management controller 210 is also illustrated as providing I2C driver 430 and wireless provisioner 432, which tunes and controls the behavior of the wireless management module over the I2C bus. Wireless management module 240 operates independently from management controller 210 in establishing and maintaining Bluetooth-based management network 700.

In establishing Bluetooth-based management network 700, wireless management module 240 is configured as a Bluetooth controller in accordance with a Bluetooth Core Specification, and can connect a single mobile device 710 to management system 200. Management controller 210 operates to provide and maintain the BLE beacon data, content, and pass keys in wireless management module 240, and directs the wireless management module to change between operating modes, such as an advertising mode, a scanning mode, a master mode, a slave mode, or another operating mode, as needed or desired. In a particular embodiment, wireless management module 240 operates to configure the transmission power level of the Bluetooth channel, and supports RSSI and RCPI reporting on the incoming signal from mobile device 710. Further, wireless management module 240 supports blacklisting and whitelisting of specific mobile devices that request access to management system 200, such as by identifying a particular MAC address, IP address, International Mobile-station Equipment Identity (IMEI), Mobile Equipment Identifier (MEID), or other unique identifier for a mobile device.

Figure 10:
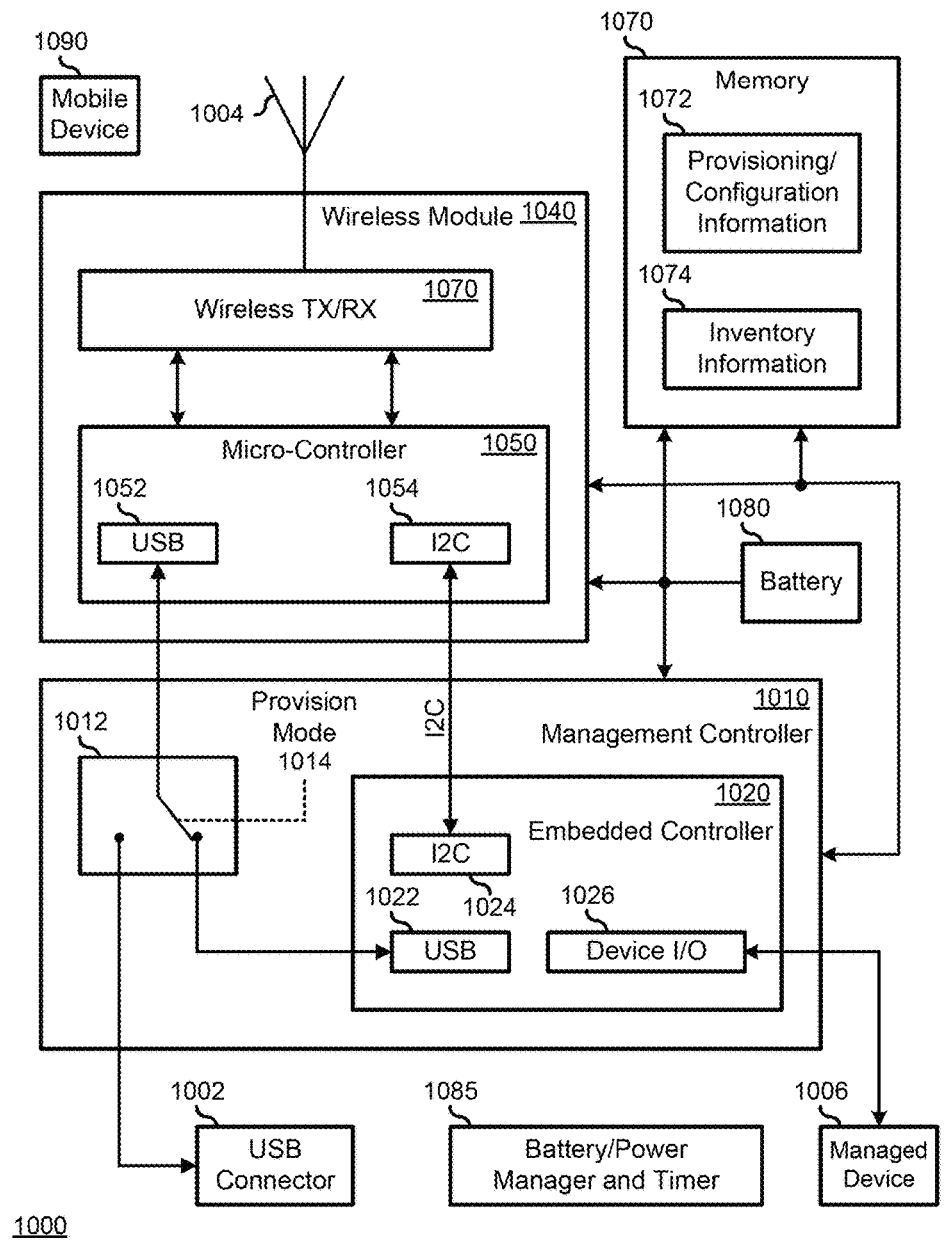
FIG. 10 is a block diagram illustrating the management system of FIG. 2, and a method for provisioning and inventorying a powered off server in a data center.

FIG. 10 illustrates a management system 1000 similar to management system 200, and that includes a management controller 1010 similar to management controller 210, a wireless management module 1040 similar to wireless management module 240, a memory device 1070, a battery 1080, a battery and power manager and timer module 1085, a USB connector 1002, a wireless device antenna 1004, and a managed device 1006 of the information handling system that includes the management system. Management controller 1010 is similar to management controller 210, and includes a USB multiplexor 1012, and an embedded controller 1020. Embedded controller 1020 includes a USB interface 1022, an I2C interface 1024, and a device I/O interface 1026. USB multiplexor 1012 is connected to USB connector 1002, and to USB interfaces 1022 and 1052 to make a selected point-to-point USB connection. Here, USB multiplexor 1012 is illustrated as including a provision mode input 1014 that connects USB connector 202 directly to USB interface 252 when management controller 210 is in a powered-off provisioning mode.

Wireless management module 1040 is similar to wireless management module 240, and includes a micro-controller 1050, and a wireless transceiver module 1070. Micro-controller 1050 includes a USB interface 1052, and an I2C interface 1054. Management controller 210 and wireless management module 240 will be understood to include other elements, such as memory devices, power systems, and other elements as needed or desired to perform the operations as described herein. Wireless transceiver module 1070 represents a mixed-signal integrated circuit device that operates to provide the radio signal interface to a mobile device 1090 and to provide data interfaces to micro-controller 1050.

Memory device 1070 can include a non-volatile memory device, such as an NVRAM device, a Flash device, or another non-volatile memory device that retains data stored therein when the power to wireless management system 1000 is powered off. Memory device 1070 can also include a volatile memory device that retains data stored therein when the power to wireless management system 1000 is powered off by receiving a data retention power level from battery 1080. Battery 1080 is also connected to selectively provide power to management controller 1010, to wireless module 1040, and to managed device 1006, as needed or desired. Battery and power manager and timer 1085 operates to manage the charge and discharge operations of battery 1080. In managing the charge and discharge operations of battery 1080, battery and power manager and timer 1085 operates in accordance with various battery management techniques and procedures as are known to the skilled artisan, and as dictated by the type of battery 1080.

Battery and power manager and timer 1085 also operates to determine when and how to selectively connect battery 1080 to management controller 1010, to wireless management module 1040, and to managed device 1006. In particular, battery and power manager and timer 1085 provides a wireless communication mode wherein battery 1080 is connected to wireless management module 1040, such that the wireless management module is provided with sufficient power to operate wireless transceiver module 1070 to establish and maintain a wireless connection with mobile device 1090, to operate micro-controller 1050 to receive information from the mobile device and to store the received information in memory device 1070, and to the operate micro-controller to retrieve information from the memory device and to transmit the retrieved information to the mobile device. In a particular embodiment, in the wireless communication mode, battery and battery 1080 is also connected to management controller 1010 and to managed device 1006, such the management controller is provided with sufficient power to operate embedded controller 1020 to retrieve information from memory device 1070 and to store the retrieved information to the managed device, and to operate the embedded controller to load information from the managed device and to store the loaded information to the memory device. In another embodiment, in the wireless communication mode, battery and battery 1080 is also connected to management controller 1010 and to managed device 1006, such the management controller is provided with sufficient power to operate embedded controller 1020 to receive information from mobile device 1090 via micro-controller 1050 and to store the received information in the managed device, and to operate the embedded controller to load information from the managed device and to transmit the loaded information to the mobile device via the micro-controller. Note that, as illustrated, memory device 1070 is connected to both management controller 1010 and wireless management module 1040, but this is not necessarily so. In particular, memory device 1070 can be connected to only one of management controller 1010 and wireless management module 1040, as needed or desired, and the memory device can be accessed by the unconnected element via the connected element.

In a particular embodiment, wireless transceiver module 1070 is provided with sufficient power from battery 1080 to operate the wireless transceiver module in a listening mode to detect an attempt by mobile device 1090 to establish a wireless connection with wireless management module 1040. Here, in response, battery and power manager and timer 1085 operates to provide wireless management module 1040 with sufficient power to authenticate the user of mobile device 1090, and if the user is authenticated, to place management system 1000 into the wireless communication mode. Here, for example, wireless management module 1040 can be configured to hide a SSID, and wireless device 1090 can be configured with the SSID and can attempt to establish the wireless connection based upon the SSID. Here further, battery and power manager and timer 1085 can be configured to provide wireless transceiver module 1070 with power on a periodic basis, in order to conserve power. For example, a duty cycle for the listening mode can be determined such that the ratio of on-time to off-time provides for sufficient on time to permit reliable detection of an attempt by mobile device 1090 to establish the wireless connection, while also providing for a minimum power draw from battery 1080. As such, battery and power manager and timer 1085 includes timers for providing the duty cycle for listening mode. In a particular embodiment, the duty cycle timer provides a pre-determined duty cycle, or the duty cycle timer provides a configurable duty cycle. In another example where battery and power manager and timer 1085 is configured to provide power on a periodic basis, the battery and power manager and timer can be configured to provide power at a predetermined time for a predetermined time interval, such as for five minutes every hour at the bottom of the hour, for one hour every day at 12:00 AM, or at another predetermined time for another predetermined interval, as needed or desired. Here, battery and power manager and timer 1085 includes a real time clock and one or more additional timer, as needed or desired.

In a particular embodiment, the wireless communication mode is enabled to permit the provisioning of management system 1000, the information handling system that includes the management system, or both. Here, after mobile device 1090 is wirelessly connected and authenticated to wireless management module 1040, the mobile device provides provisioning and configuration information to the wireless management module. Micro-controller 1050 stores the provisioning and configuration information 1072 to a memory location in memory device 1070. Provisioning and configuration information 1072 can include information to configure the operation of management system 1000, such as wireless access information for wireless management module 1040, access and authentication credentials for access to the management system, management system operating settings for managing the information handling system, such as hardware set-points like thermal set-points and cooling fan speed set-points, and other managed configuration settings typical to the out-of-band management of an information handling system as are known to the skilled artisan. Provisioning and configuration information 1072 can also include information to configure the in-band operation of the information handling system, such as a root password for the information handling system, a boot device order, a network setting, a BIOS setting, or other operational settings for an information handling system as are known to the skilled artisan. Further, provisioning and configuration information 1072 can include a firmware image or update for one or more element of management system 1000, for one or more element of the information handling system, for a BIOS or UEFI of the information handling system, or for another element of the information handling system, as needed or desired.

In a particular embodiment, provisioning and configuration information 1072 is retained in memory 1070 and is not applied to management system 1000 and the information handling system until a later time, such as when the information handling system is booted up a next time. Here, when the information handling system is booted up the next time, management controller 1010 retrieves provisioning and configuration information 1072 and provides the applicable portions of the information to management system 1000, to a managed device such as managed device 1006, to the in-band environment of the information handling system, or another element, as needed or desired. In another embodiment, provisioning and configuration information 1072 is applied directly to management system 1000 and the information handling system, substantially when the provisioning and configuration information is received from mobile device 1090.

In a particular use case, the provisioning of management system 1000 and the information handling system permits the in-box provisioning prior to shipment or installation of the information handling system. For example, a manufacturer of a server rack can provide the server rack with certain default configurations in the manufacturing process, and box-up the server rack. However, prior to shipment, the manufacturer can become aware of a critical update related to a particular setting, a firmware version, or the like, or can receive a customer requested configuration for a setting, a firmware version, or the like, and the manufacturer can wirelessly provide the associated provisioning and configuration information to the information handling system without having to unbox and power up the server rack. Similarly, the user of the server rack can wirelessly provide the provisioning and configuration information to the information handling system before powering up the server rack. In this way, the user can provision and configure multiple server racks in a new data center, or portion thereof, prior to powering up the server racks. In a particular case, the manufacturer can provide a default SSID and default access credentials at the time of manufacture, and can provide a user supplied SSID and user provided access credentials such that the information handling system cannot be tampered with in transit.

In a particular embodiment, battery and power manager and timer 1085 configures management system 1000 such that similar provisioning and configuration can be performed on an unpowered information handling system as described above, except that, instead of establishing a wireless connection to mobile device 1090, the management system establishes a USB connection to a USB device connected to USB connector 1002. Other than the type of device connected to management system 1000, the use of the USB device provides the same functionality to provision and configure the management system and the information handling system, as does mobile device 1090. Here, further, where the USB device provides USB On-The-Go (OTG) functionality, the USB device can also function to power one or more of the elements of management system 1000.

In another embodiment, the wireless communication mode is enabled to permit a user of mobile device 1090 to obtain provisioning and configuration information 1072 from memory device 1070, in order to identify the information handling system that includes management system 1000, to identify the current configuration and provisioning version for the management system or the information handling system, or to otherwise utilize the provisioning and configuration information, as needed or desired. For example, provisioning and configuration information 1072 can be obtained to determine a desired location for the information handling system within a datacenter, to determine whether or not updated provisioning and configuration information is available, or for other purposes, as needed or desired. Here, provisioning and configuration information 1072 can include a MAC address for management system 1000 or for the information handling system, a service tag for the information handling system, or other information as may be needed or desired to identify the management system or the information handling system. In another example, provisioning and configuration information 1072 can include a pointer or path to an OS or disk image repository that can be used when the information handling system is first powered on to provide for the auto-configuration of the information handling system. In yet another example, provisioning and configuration information 1072 can be provided to categorize or label the information handling system in terms of the service to be provided by the information handling system, such as as a web server, a database server, an exchange server, a switch/router/bridge, a storage device, or the like.

In another embodiment, the wireless communication mode is enabled after battery and power manager and timer 1085 has initiated an inventory mode to provide for the inventorying of the parts and elements of management system 1000, the information handling system that includes the management system, or both. Here, battery and power manager and timer 1085 operates to provide sufficient power to management controller 1010 to monitor and manage the elements of the management system 1000 and of the information handling system. As a first matter, the monitoring and management of the elements of management system 1000 and of the information handling system includes tracking and maintaining an up-to-date list, or inventory, of the parts that are included on the management system and of the information handling system, determining a status for the parts on the inventory, such as whether or not a particular part is currently being utilized, and determining whether or not one or more parts are in need of service or replacement. Management controller 1010 operates to store inventory information 1074 in memory device 1070, based upon the inventory, the parts' utilization statuses, and the parts' repair and replacement statuses. Here, after mobile device 1090 is wirelessly connected and authenticated to wireless management module 1040, the mobile device provides inventory information 1074 to the mobile device. Battery and power manager and timer 1085 can initiate the inventory mode on a periodic basis, based upon a predetermined interval, as needed or desired. As such, battery and power manager and timer 1085 includes one or more timers to determine the predetermined interval.

Figure 11:
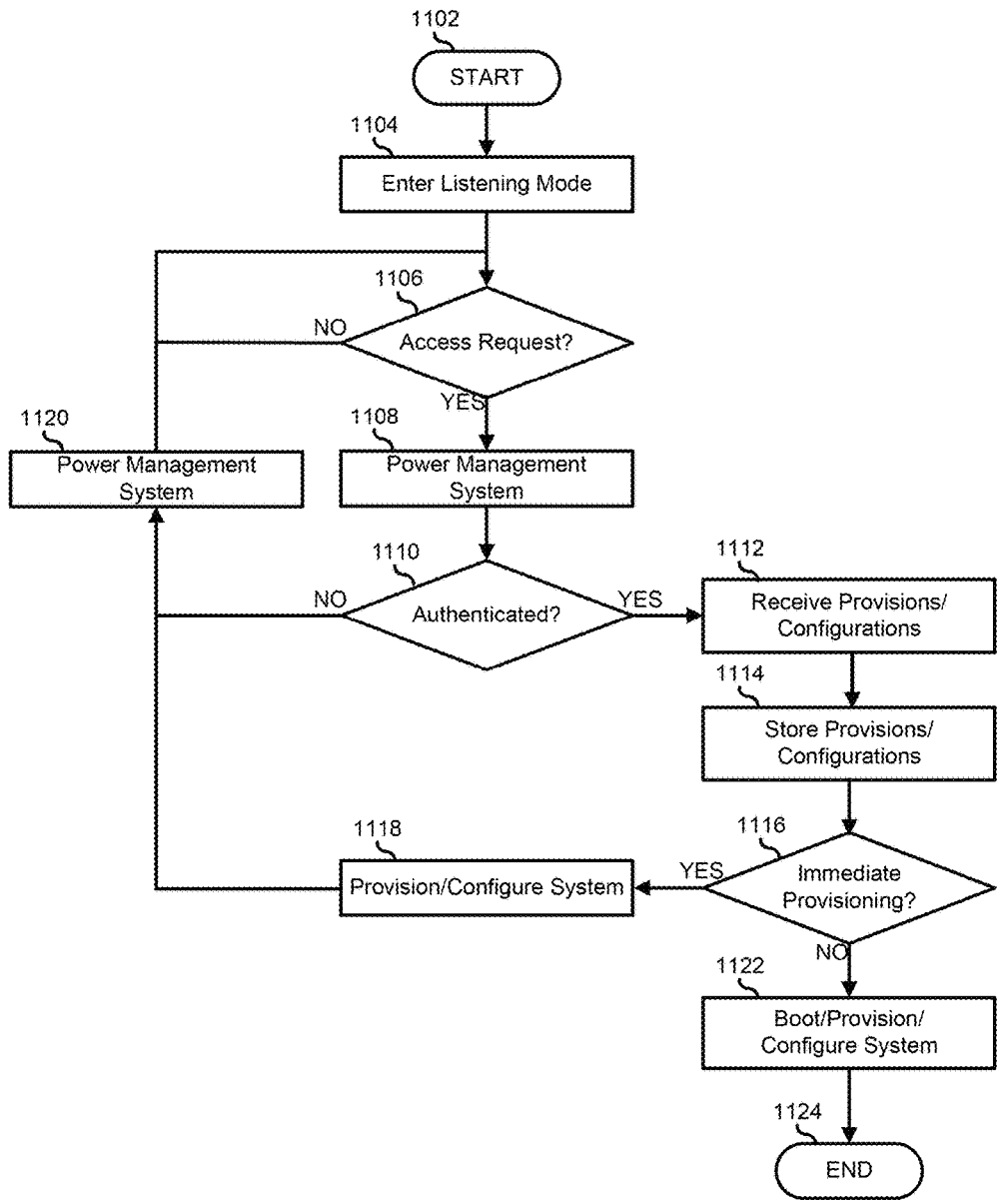
FIG. 11 is a flowchart illustrating a method for provisioning a powered off server in a data center according to an embodiment of the present disclosure.

FIG. 11 illustrates a method for provisioning a powered off server in a data center, starting at block 1102. A wireless management module enters a listening mode in block 1104. For example, battery and power manager and timer 1085 can connect battery 1080 to provide sufficient power to wireless transceiver module 1070 to enter the listening mode. A decision is made as to whether or not a mobile device has made an access request to establish a wireless connection with the wireless management module in decision block 1106. If not, the "NO" branch of decision block 1106 is taken and the method cycles back to decision block 1104 until a mobile device makes an access request. If a mobile device has made an access request to establish a wireless connection with the wireless management module, the "YES" branch of decision block 1106 is taken and a management system including the wireless management module is powered on in block 1108. For example, when mobile device 1090 makes an access request to establish a wireless connection with wireless transceiver module 1070, battery and power manager and timer 1085 can connect battery 1080 to provide sufficient power to wireless management module 1040 to authenticate the user of the mobile device.

A decision is made as to whether or not the user of the mobile device is authenticated onto the management system in decision block 1110. If not, the "NO" branch of decision block 1110 is taken, the management system, except for the wireless transceiver module, is powered off in block 1120, and the method cycles back to decision block 1104 until a mobile device makes an access request. For example, if the user of mobile device 1090 is not authenticated onto management system 1000, then the access attempt by the mobile device is denied, and battery and power manager and timer 1085 powers off micro-controller 1050, and leaves wireless transceiver module 1070 in the listening mode. If the user of the mobile device is authenticated onto the management system, the "YES" branch of decision block 1110 is taken, provision and configuration information is received from the mobile device in block 1112, and the provision and configuration information is stored in block 1114. For example, provisioning and configuration information 1072 can be received from mobile device 1090 and can be stored to memory device 1070.

A decision is made as to whether or not the provisioning of the management system and the information handling system is to be performed immediately upon receipt of the provision and configuration information in decision block 1116. If so, the "YES" branch of decision block 116 is taken, the provision and configuration information is applied to the management controller and the information handling system in block 1118, the management system, except for the wireless transceiver module, is powered off in block 1120, and the method cycles back to decision block 1104 until a mobile device makes an access request. If the provisioning of the management system and the information handling system is not to be performed immediately upon receipt of the provision and configuration information, the "NO" branch of decision block 1116 is taken, the information handling system is booted at a later time and the management system and the information handling system is provisioned and configured in response to booting the information handling system in block 1122, and the method ends in block 1124.

Figure 12:
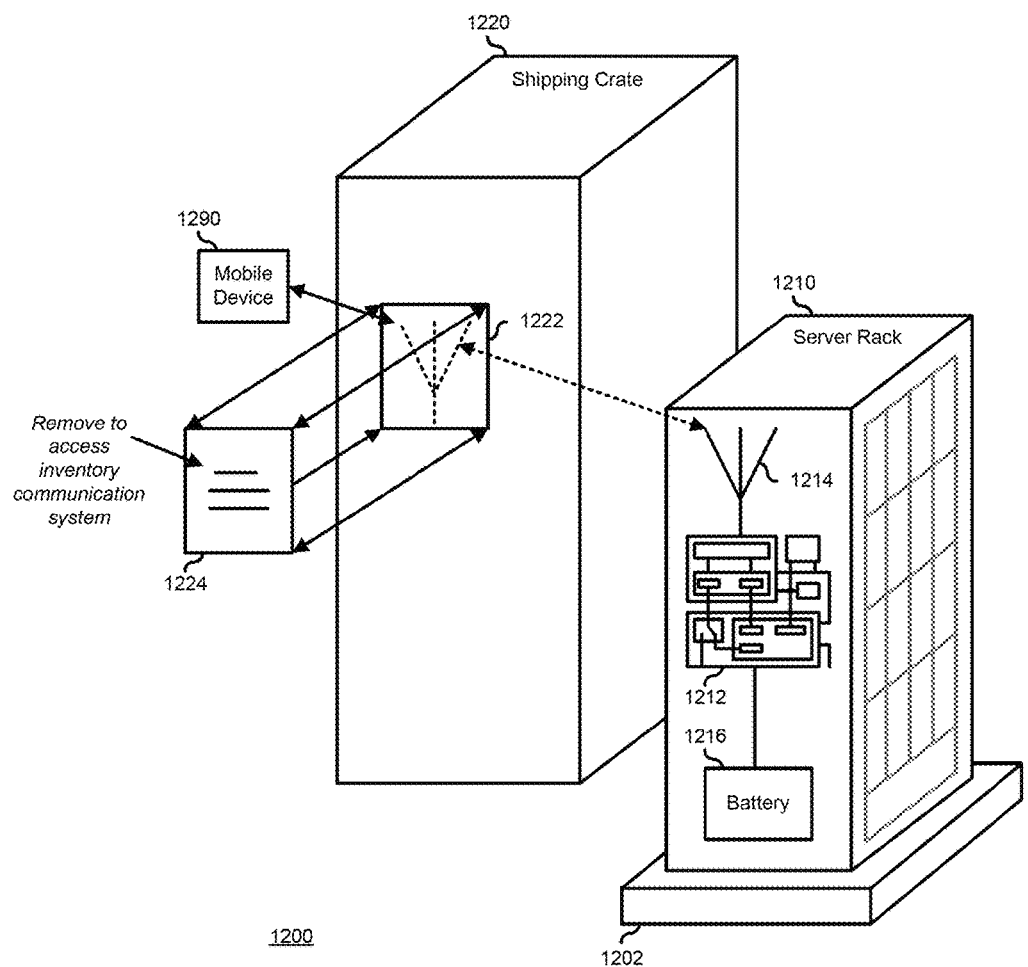
FIG. 12 is diagram of a shipping container for an information handling system according to an embodiment of the present disclosure.

FIG. 12 illustrates a shipping container 1200 for an information handling system, illustrated as a server rack 1210. Shipping container 1200 includes a shipping pallet 1202 and a shipping crate 1220. Server rack 1210 includes a wireless management system 1212 and a battery 1216 similar to battery 1080. Wireless management system 1212 is similar to management system 1000, and particularly, the wireless management system includes a wireless management module similar to wireless management module 1040 that can establish a wireless connection to a mobile device 1290 via an antenna 1214. Further, server rack 1210 is configured such that one or more element of wireless management system 1212 and the server rack can be provisioned and configured while the server rack is powered off by providing power to the wireless management system in various power modes from a battery 1216.

For the purposes of shipping server rack 1210, the server rack is affixed to shipping palate 1202 to provide a rigid mounting surface that is easily manipulable by various cargo and freight handling equipment, as is known in the art. Shipping crate 1220 is configured to enclose server rack 1210 and to be affixed to shipping palate 1202 to provide an environment surrounding the server rack that is protected from mechanical intrusion and damage, such as may occur during transit, such as bumping, jostling, piercing by sharp objects, minor falls, tipping, and the like.

Shipping palate 1202 and shipping crate 1220 are also configured to protect server rack 1210 from various levels of electro-magnetic damage, such as electro-static discharge, electro-magnetic pulse, and other electro-magnetic damage. In a particular embodiment, shipping palate 1202 and shipping crate 1220 are configured to provide a conductive faraday cage surrounding server rack 1210 to minimize induced electrical charge within the server rack. For example, the faraday cage can be provided by embedding a wire mesh in the material of shipping palate 1202 and of shipping crate 1220, and providing an electrical connection between the wire mesh in the shipping palate and the wire mesh in the shipping crate when the shipping crate is affixed to the shipping palate. In another example, the faraday cage can be provided by lining shipping palate 1202 and shipping crate 1220 with a conductive foam with a surface resistance of $10^{\wedge}4$ Ohms or less. In another embodiment, shipping palate 1202 and shipping crate 1220 are configured to provide an anti-static or a dissipative material with a surface resistance of between $10^{\wedge}5$ and $10^{\wedge}10$ Ohms, as needed or desired. Here, the conductive foam can double as protection against mechanical intrusion, as described above.

Note that, whether using a wire mesh or conductive, anti-static, or dissipative material, the effect is that wireless management system 1212 is limited in its ability to establish a wireless communication link with mobile device 1290 due to the protective qualities of the conductive, anti-static, or dissipative material. As such, shipping crate 1220 is configured with a void 1222 in the electro-magnetic protection material that corresponds with the physical location of antenna 1214, such that wireless management system 1212 can establish a wireless connection to mobile device 1290 through the void. In a particular embodiment, void 1222 is configured as a tuned cavity transmission line with physical dimensions that are tuned to a communication frequency of the wireless communication channel between wireless management system 1212 and mobile module 1290 that permits the establishment of the wireless communication channel. Here, void 1222 continues to maintain electro-magnetic protection against signals at other frequencies. An example of tuning of void 1222 can include providing a wire mesh with different mesh characteristics, such as different mesh spacing that provides for the selective transmission of the wireless communication channel while simultaneously blocking unwanted signals. In a particular embodiment, where server rack 1210 includes multiple elements, each with its own wireless management system 1212, shipping crate 1220 can include multiple voids similar to void 1222, each additional void corresponding with the physical location of the antenna for one of the additional wireless management systems.

In another embodiment, void 1222 is configured as a piece of foam that is not made with conductive, anti-static, or dissipative material, that permits the transmission of the wireless communication channel. In yet another embodiment, void 1222 is created by removing a plug 1224 that is made up of the same protective material as the rest of shipping palate 1202 and shipping crate 1220, and that is removable in order to establish a hole through which the wireless communication channel can be established. Then, after the communications between wireless management system 1212 and mobile device 1290 is completed, plug 1224 is reinserted into void 1222 to reestablish full electro-magnetic protection to server rack 1210. In a particular embodiment, the removal of plug 1224 can operate a switch that activates wireless management system 1212, and the reinsertion of the plug can operate the switch to deactivate the wireless management system.

Note that the use of server rack 1210 is illustrative only, and the shipping container described herein is equally usable for shipping other information handling systems that include a wireless management system similar to wireless management system 1212 and that is provided with a battery similar to battery 1216.

Figure 13:
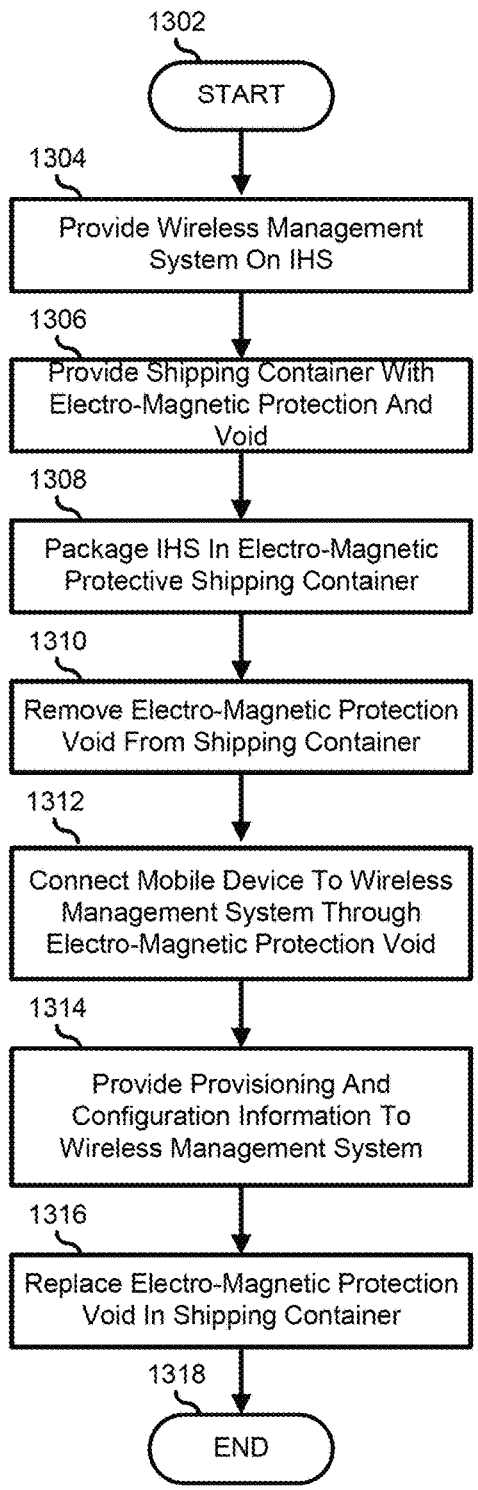
FIG. 13 is a flow chart illustrating a method for providing a wireless communication link to an unpowered information handling system through a shipping container.

FIG. 13 shows a method for providing a wireless communication link to an unpowered information handling system through a shipping container, starting at block 1302. An information handling system is provided with a wireless management system in block 1304. For example, server rack 1210 can include wireless management system 1212 that is capable of being powered by battery 1216, and of communicating wirelessly with mobile device 1290. A shipping container is provided with electro-magnetic protection and with a void in the electro-magnetic protection in block 1306. For example, shipping container 1200 can include shipping palate 1202 and shipping crate 1220, and the shipping crate can include void 1222 in the electro-magnetic protection, such as by including plug 1224. In another embodiment, the void in the electromagnetic protection is not provided by a plug, but is provided by other embodiments, as described above. The information handling system is packaged in the electro-magnetic shipping container in block 1308. For example, server rack 1210 can be affixed to shipping palate 1202, and shipping crate 1220 can be affixed to the shipping palate to enclose and protect the server rack. The electromagnetic protection void is removed from the shipping container in block 1310. For example, plug 1224 can be removed from shipping crate 1220. Here, shipping container 1200 can be at a manufacturer's locale, or can have been shipped to a user's locale, as needed or desired.

A mobile device is connected to the wireless management system via a wireless connection through the void in block 1312. Here, mobile device 1290 can establish a wireless connection with wireless management system 1210 through void 1222, as described above. The mobile device provides provisioning and configuration information to the wireless management system in block 1314. As such, mobile device 1390 can send provisioning and configuration information to wireless management system 1210 over the wireless connection. At this point, the provisioning and configuration information can be used to update server rack 1210 or wireless management system 1212 substantially when the provisioning and configuration information is provided, or can be used to update the server rack or the wireless management system when one or more of the elements of the server rack are next booted, as needed or desired. The electro-magnetic protection void is replaced into the shipping container in block 1316, and the method ends in block 1318. For example, plug 1224 can be replaced into void 1222 to reestablish full electro-magnetic protection to shipping container 1200.

Figure 14:
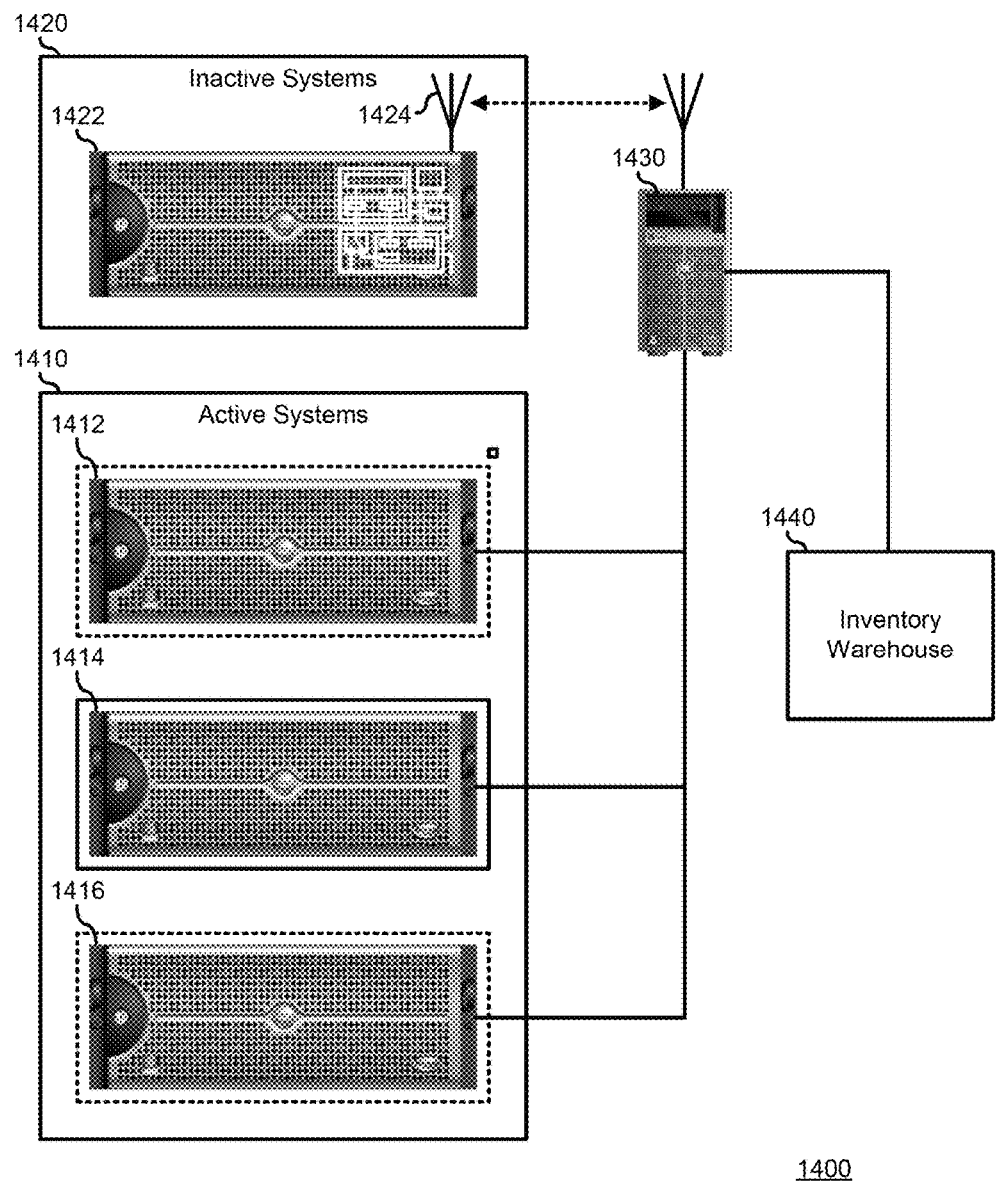
FIG. 14 is an illustration of an inventory management system in a data center according to an embodiment of the present disclosure.

FIG. 14 illustrates of an inventory management system for a data center 1400. Data center 1400 includes active systems 1410, inactive systems 1420, an inventory management server 1430, and an inventory warehouse 1440. Active systems 1410 include a system in need of a replacement part, as indicated by the solid box surrounding system 1414, systems which potentially include, but are not currently utilizing, an instantiation of the replacement part, as indicated by the dashed box surrounding systems 1412 and 1416. Systems 1412, 1414, and 1416 can represent servers in a common server rack or can represent servers in different server racks of data center 1400, as needed or desired. Systems 1412, 1414, and 1416 are characterized by the fact that they are powered on in data center 1400. Inactive systems 1420 includes a powered off server 1422 that also potentially includes an instantiation of the replacement part. Powered off server 1422 represents a server that is within a particular server rack, but is currently powered off, or a server that is located in a parts vault, a storage shelf, or is otherwise removed from a server rack.

Servers 1412, 1414, and 1416 are configured to monitor and manage the elements of the servers. As a first matter, the monitoring and management of the elements of the servers includes tracking and maintaining an up-to-date list, or inventory, of the parts that are included on each of servers 1412, 1414, and 1416, a status for the parts on the inventory, such as whether or not a particular part is currently being utilized on the associated server, and a status for the servers, such as whether or not the function or operation being provided by a particular server is considered as a business critical function or as a non-critical or back-up function. The monitoring and management of the elements of servers 1412, 1414, and 1416 also includes determining whether or not one or more parts of the servers are in need of service or replacement. In this way, server 1414 can identify that it is in need of the replacement part.

Inventory management server 1430 is connected to active servers 1412, 1414, and 1416 by a persistent network communication link, such as an Ethernet connection on a management network, a wireless local area network (WLAN), or another persistent network communication link, as needed or desired. As such, servers 1412, 1414, and 1416 are configured to provide inventory management server 1430 with up-to-date inventory information, parts status, and repair parts needs. Inactive server 1422 includes a wireless management system 1424 similar to management system 1000 that is configured to communicate over a wireless connection with inventory management server 1430, and to provide inventory information and status information to the inventory management server. Inventory management system 1430 operates to determine if one or more of servers 1412, 1416, and 1422 includes the part in need of service or replacement of server 1414. If not, inventory management server 1430 issues a parts request to inventory warehouse 1440 to have the part delivered. If one of servers 1412 and 1416 are deemed to be providing a non-critical function, and also includes the part in need of service or replacement, a datacenter technician can be sent to the server having the part to scavenge the part from the server for replacement into server 1414. Here, inventory management server 1430 issues a parts request to inventory warehouse 1440 to have the part delivered for replacement into the server that had the part scavenged therefrom. Likewise, if server 1422 includes the part in need of service or replacement, the datacenter technician can be sent to the server to scavenge the part from the server for replacement into server 1414. Here, by including inventory and status information from inactive server 1422, data center 1400 more effectively manages parts inventories, and is able to more effectively utilized unused parts from elements of the data center that are note in service.

Figure 15:
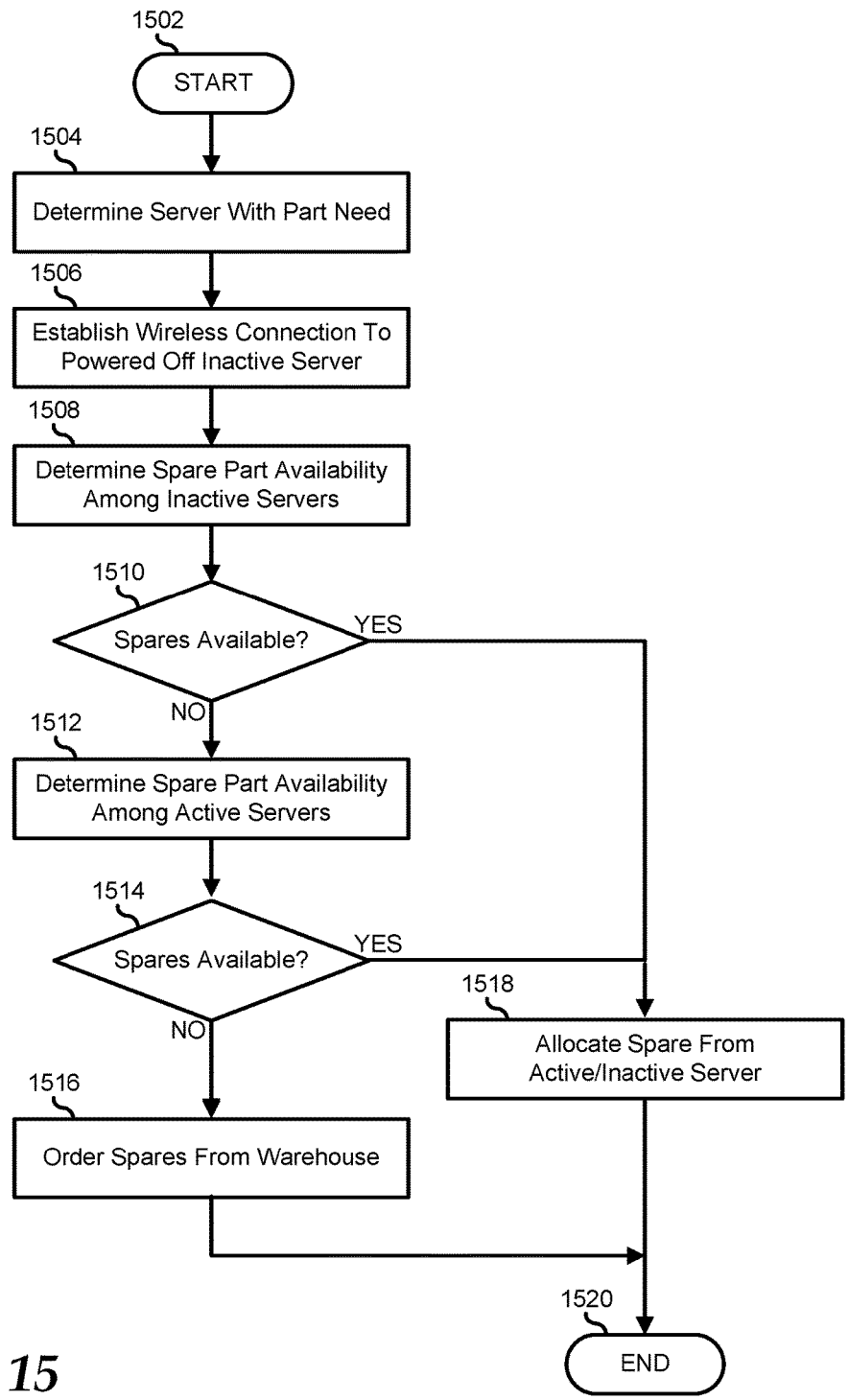
FIG. 15 is a flowchart illustrating a method for inventorying an unpowered information handling system according to an embodiment of the present disclosure.

FIG. 15 illustrates a method for inventorying an unpowered information handling system, starting at block 1502. A server or other element of a data center determines that a part thereof is in need of replacement in block 1504. For example, server 1414 can determine that a particular part thereof is in need of replacement, and can communicate that need to inventory management server 1430. Wireless connection is established with powered off servers that include wireless management systems in block 1506. For example, inventory management server 1430 can establish a wireless connection with wireless management controller 1424 of powered off server 1422. Inventories of spare parts available in the inactive servers are determined by the powered off servers in block 1508. For example, wireless management system 1424 can power up sufficient resources of server 1422 to determine the current parts inventory and can communicate the inventory to inventory management server 1430 via the wireless connection.

A decision is made as to whether or not any of the parts that are needed by the server that communicated the need are available in the powered off servers in decision block 1510. If so, the "YES" branch of decision block 1510 is taken, the spare part is allocated from the one or more of the powered off servers that included the part in their inventories to the server that communicated the need in block 1518, and the method ends in block 1520. If none of the parts that are needed by the server that communicated the need are available in the powered off servers, the "NO" branch of decision block 1510 is taken, and inventories of spare parts available in the active servers are determined by the powered on servers in block 1512. For example, servers 1412 and 1416 can determine their current parts inventories and can communicate their inventories to inventory management server 1430.

A decision is made as to whether or not any of the parts that are needed by the server that communicated the need are available in the powered on servers in decision block 1514. If so, the "YES" branch of decision block 1514 is taken, the spare part is allocated from the one or more of the powered on servers that included the part in their inventories to the server that communicated the need in block 1518, and the method ends in block 1520. If none of the parts that are needed by the server that communicated the need are available in the powered on servers, the "NO" branch of decision block 1514 is taken, the part is ordered from a parts warehouse in block 1516, and the method ends in block 1520. For example, inventory management server 1430 can order the needed part from inventory warehouse 1440.

Figure 8:
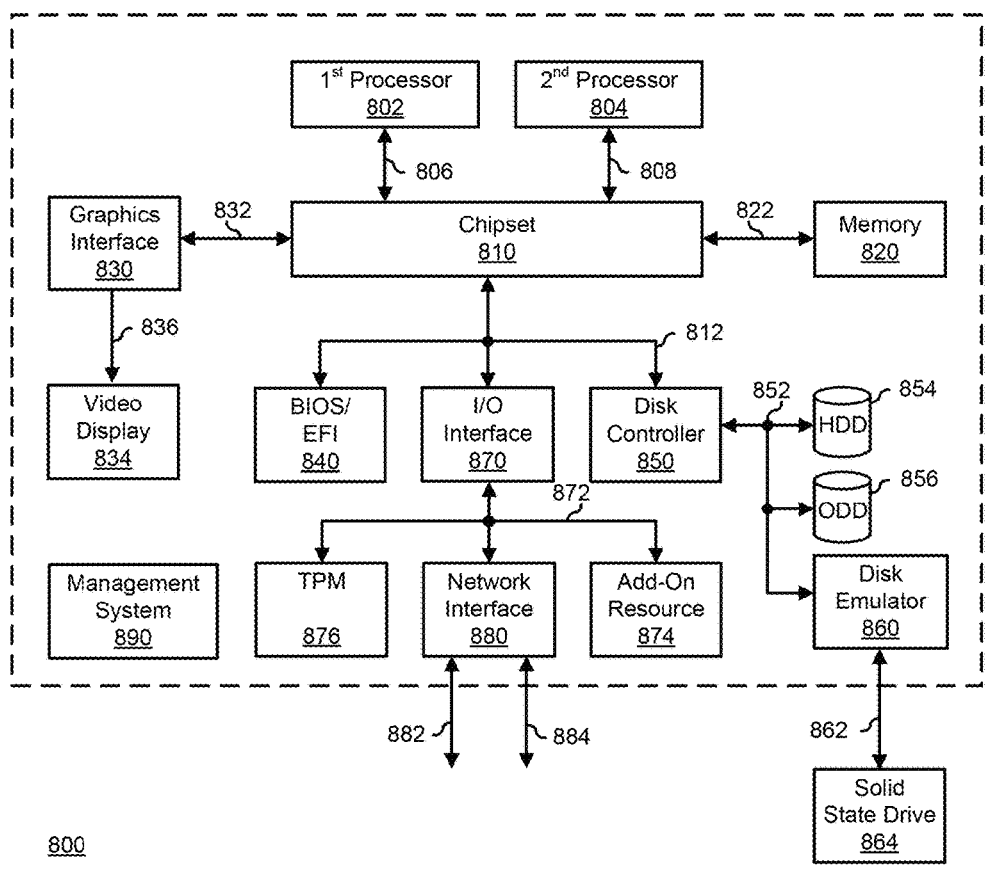
FIG. 8 is a block diagram illustrating a generalized information handling system according to an embodiment of the present disclosure.
Figure 9:
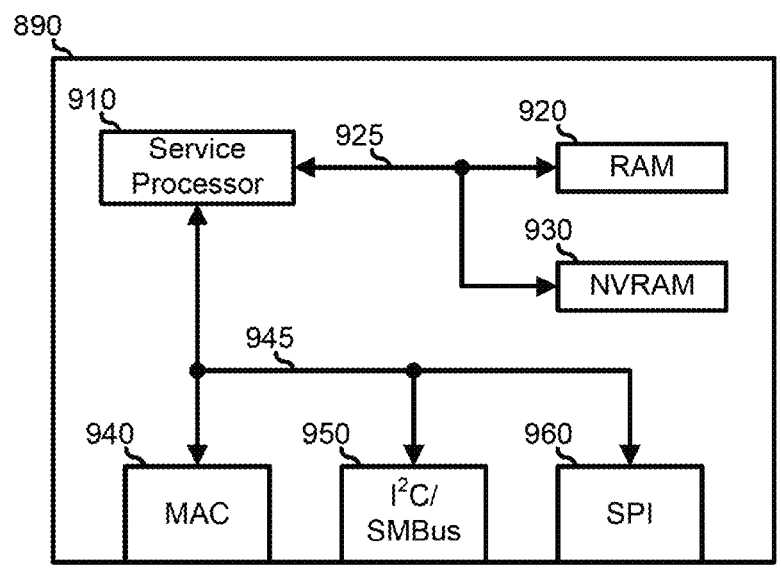
FIG. 9 is a block diagram illustrating an embodiment of a management system of the information handling system of FIG. 8.

FIG. 8 illustrates a generalized embodiment of information handling system 800. For purpose of this disclosure information handling system 800 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 800 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 800 can include processing resources for executing machine-executable code, such as a central processing unit (CPU), a programmable logic array (PLA), an embedded device such as a System-on-a-Chip (SoC), or other control logic hardware. Information handling system 800 can also include one or more computer-readable medium for storing machine-executable code, such as software or data. Additional components of information handling system 800 can include one or more storage devices that can store machine-executable code, one or more communications ports for communicating with external devices, and various input and output (I/O) devices, such as a keyboard, a mouse, and a video display. Information handling system 800 can also include one or more buses operable to transmit information between the various hardware components.

Information handling system 800 can include devices or modules that embody one or more of the devices or modules described above, and operates to perform one or more of the methods described above. Information handling system 800 includes a processors 802 and 804, a chipset 810, a memory 820, a graphics interface 830, include a basic input and output system/extensible firmware interface (BIOS/EFI) module 840, a disk controller 850, a disk emulator 860, an input/output (I/O) interface 870, a network interface 880, and a management system 890. Processor 802 is connected to chipset 810 via processor interface 806, and processor 804 is connected to the chipset via processor interface 808. Memory 820 is connected to chipset 810 via a memory bus 822. Graphics interface 830 is connected to chipset 810 via a graphics interface 832, and provides a video display output 836 to a video display 834. In a particular embodiment, information handling system 800 includes separate memories that are dedicated to each of processors 802 and 804 via separate memory interfaces. An example of memory 820 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 840, disk controller 850, and I/O interface 870 are connected to chipset 810 via an I/O channel 812. An example of I/O channel 812 includes a Peripheral Component Interconnect (PCI) interface, a PCI-Extended (PCI-X) interface, a high speed PCI-Express (PCIe) interface, another industry standard or proprietary communication interface, or a combination thereof. Chipset 810 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 840 includes BIOS/EFI code operable to detect resources within information handling system 800, to provide drivers for the resources, initialize the resources, and access the resources. BIOS/EFI module 840 includes code that operates to detect resources within information handling system 800, to provide drivers for the resources, to initialize the resources, and to access the resources.

Disk controller 850 includes a disk interface 852 that connects the disc controller to a hard disk drive (HDD) 854, to an optical disk drive (ODD) 856, and to disk emulator 860. An example of disk interface 852 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 860 permits a solid-state drive 864 to be connected to information handling system 800 via an external interface 862. An example of external interface 862 includes a USB interface, an IEEE 1394 (Firewire) interface, a proprietary interface, or a combination thereof. Alternatively, solid-state drive 864 can be disposed within information handling system 800.

I/O interface 870 includes a peripheral interface 872 that connects the I/O interface to an add-on resource 874, to a TPM 876, and to network interface 880. Peripheral interface 872 can be the same type of interface as I/O channel 812, or can be a different type of interface. As such, I/O interface 870 extends the capacity of I/O channel 812 when peripheral interface 872 and the I/O channel are of the same type, and the I/O interface translates information from a format suitable to the I/O channel to a format suitable to the peripheral channel 872 when they are of a different type. Add-on resource 874 can include a data storage system, an additional graphics interface, a network interface card (NIC), a sound/video processing card, another add-on resource, or a combination thereof. Add-on resource 874 can be on a main circuit board, on separate circuit board or add-in card disposed within information handling system 800, a device that is external to the information handling system, or a combination thereof.

Network interface 880 represents a NIC disposed within information handling system 800, on a main circuit board of the information handling system, integrated onto another component such as chipset 810, in another suitable location, or a combination thereof. Network interface device 880 includes network channels 882 and 884 that provide interfaces to devices that are external to information handling system 800. In a particular embodiment, network channels 882 and 884 are of a different type than peripheral channel 872 and network interface 880 translates information from a format suitable to the peripheral channel to a format suitable to external devices. An example of network channels 882 and 884 includes InfiniBand channels, Fibre Channel channels, Gigabit Ethernet channels, proprietary channel architectures, or a combination thereof. Network channels 882 and 884 can be connected to external network resources (not illustrated). The network resource can include another information handling system, a data storage system, another network, a grid management system, another suitable resource, or a combination thereof.

Management controller 890 provides for out-of-band monitoring, management, and control of the respective elements of information handling system 800, such as cooling fan speed control, power supply management, hot-swap and hot-plug management, firmware management and update management for system BIOS or UEFI, Option ROM, device firmware, and the like, or other system management and control functions as needed or desired. As such, management system 890 provides some or all of the functions and features of the management systems described herein.

The preceding description in combination with the Figures is provided to assist in understanding the teachings disclosed herein. The preceding discussion focused on specific implementations and embodiments of the teachings. This focus has been provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims.

In the claims, means-plus-function clauses are intended to cover the structures described herein as performing the recited function and not only structural equivalents, but also equivalent structures.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A crate for shipping an information handling system, the crate comprising:
    a first side including an electro-magnetic protective material, wherein the electro-magnetic protective material inhibits electro-magnetic intrusions into the information handling system;
    a second side including:
        a first portion having the electro-magnetic protective material; and
        a second portion devoid of the electro-magnetic protective material, the second portion to passively pass a wireless electro-magnetic signal to the information handling system from a wireless management system, wherein in passing the wireless electromagnetic signal passively through the second portion the wireless electromagnetic signal passes directly from the wireless management system to the information handling system without passing through any other device, and wherein the second portion includes a shape that provides a channel that is tuned to a frequency of the wireless electro-magnetic signal.

2. The crate of claim 1, wherein the electro-magnetic protective material comprises a wire mesh.

3. The crate of claim 1, wherein the electro-magnetic protective material comprises a first impact resistant foam.

4. The crate of claim 3, wherein the second portion comprises a second impact resistant foam that is not electro-magnetic protective.

5. The crate of claim 1, wherein:
    the second portion comprises a hole cut out of the first portion
    the second side further including a plug comprising the electro-magnetic protective material, and having a same shape as the hole, the plug to block the wireless electro-magnetic signal when the plug is inserted into the hole.

6. The crate of claim 1, wherein the second portion is located proximate to a wireless electro-magnetic signal antenna of the information handling system.

7. The crate of claim 1, wherein the electro-magnetic protective material comprises a conductive material having a surface resistance of less than 1000 Ohms.

8. The crate of claim 1, wherein the electro-magnetic protective material comprises an anti-static material having a surface resistance of between 10 kilo-Ohms and 10 giga-Ohms.

9. A method, comprising:
    providing a first side of a shipping crate for shipping an information handling system, the first side including an electro-magnetic protective material to inhibit electro-magnetic intrusions into the information handling system;
    providing a first portion of a second side of the shipping crate, the first portion including the electro-magnetic protective material;
    providing a second portion of the second side of the shipping crate, wherein the second portion is devoid of the electro-magnetic protective material;
    passing a wireless electro-magnetic signal passively through the second portion of the second side from a wireless management system to the information handling system, wherein in passing the wireless electro-magnetic signal passively through the second portion of the second side, the wireless electromagnetic signal passes directly from the wireless management system to the information handling system without passing through any other device; and
    shaping the second portion of the second side to provide a channel that is tuned to a frequency of the wireless electro-magnetic signal.

10. The method of claim 9, wherein the electro-magnetic protective material comprises a wire mesh.

11. The method of claim 9, wherein the electro-magnetic protective material comprises a first impact resistant foam.

12. The method of claim 11, wherein the second portion comprises a second impact resistant foam that is not electro-magnetic protective.

13. The method of claim 9, wherein, in providing the second portion of the second side, the method further comprises:
    cutting a hole cut out of the first portion
    providing a plug having a same shape as the hole, the plug including the electro-magnetic protective material;
    inserting the plug into the hole to block the wireless electro-magnetic signal.

14. The method of claim 9, wherein the second portion is located proximate to a wireless electro-magnetic signal antenna of the information handling system.

15. The method of claim 9, wherein the electro-magnetic protective material comprises a conductive material having a surface resistance of less than 1000 Ohms.

16. The method of claim 9, wherein the electro-magnetic protective material comprises an anti-static material having a surface resistance of between 10 kilo-Ohms and 10 giga-Ohms.

17. A shipping unit comprising:
an information handling system including a wireless management system to establish a wireless communication channel; and
a shipping crate to enclose the information handling system, the shipping crate including:
 a first portion having an electro-magnetic protective material, wherein the electro-magnetic protective material inhibits electro-magnetic intrusions into the information handling system; and
 a second portion devoid of the electro-magnetic protective material, the second portion to passively pass the wireless communication channel from the wireless management system to the information handling system from a wireless management system, wherein in passing the wireless electromagnetic signal passively through the second portion of the second side, the wireless electromagnetic signal passes directly from the mobile device to the information handling system without passing through any other device, and wherein the second portion includes a shape that provides a channel that is tuned to a frequency of the wireless electro-magnetic signal.

18. The shipping unit of claim 17, wherein the information handling system receives configuration information via the wireless communication channel through the second portion.

* * * * *